United States Patent
Wei et al.

(10) Patent No.: US 11,984,429 B2
(45) Date of Patent: *May 14, 2024

(54) LEADLESS POWER AMPLIFIER PACKAGES INCLUDING TOPSIDE TERMINATION INTERPOSER ARRANGEMENTS AND METHODS FOR THE FABRICATION THEREOF

(71) Applicant: NXP USA, Inc., Austin, TX (US)

(72) Inventors: Yun Wei, Chandler, AZ (US); Scott Duncan Marshall, Chandler, AZ (US); Lakshminarayan Viswanathan, Chandler, AZ (US); Taek Kyu Kim, Chandler, AZ (US); Ricardo Uscola, Tempe, AZ (US); Fernando A. Santos, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 102 days.

This patent is subject to a terminal disclaimer.

(21) Appl. No.: 17/491,309

(22) Filed: Sep. 30, 2021

(65) Prior Publication Data

US 2023/0115340 A1 Apr. 13, 2023

(51) Int. Cl.
*H01L 25/065* (2023.01)
*H01L 23/31* (2006.01)
(Continued)

(52) U.S. Cl.
CPC ...... *H01L 25/0655* (2013.01); *H01L 23/3121* (2013.01); *H01L 23/49811* (2013.01);
(Continued)

(58) Field of Classification Search
CPC ............ H01L 25/0655; H01L 23/3121; H01L 23/49811
See application file for complete search history.

(56) References Cited

U.S. PATENT DOCUMENTS

| 7,892,882 B2 | 2/2011 | Leal et al. |
| 9,673,162 B2 | 6/2017 | Viswanathan et al. |

(Continued)

FOREIGN PATENT DOCUMENTS

CN 109712946 A 5/2019

OTHER PUBLICATIONS

U.S. Appl. No. 17/077,583; Notice of Allowance dated Mar. 30, 2022; 22 pages.

(Continued)

*Primary Examiner* — Thao P Le

(57) ABSTRACT

Leadless power amplifier (PA) packages having topside termination interposer (TTI) arrangements, and associated fabrication methods, are disclosed. Embodiments of the leadless PA package include a base flange, a first set of interposer mount pads, a first RF power die, a package body. The first RF power die is attached to a die mount surface of the base flange and electrically interconnected with the first set of interposer mount pads. The TTI arrangement is electrically coupled to the first set of interposer mount pads and projects therefrom in the package height direction. The package body encloses the first RF power die and having a package topside surface opposite the lower flange surface. Topside input/output terminals of the PA package are accessible from the package topside surface and are electrically interconnected with the first RF power die through the TTI arrangement and the first set of interposer mount pads.

20 Claims, 22 Drawing Sheets

(51) Int. Cl.
  *H01L 23/498* (2006.01)
  *H01L 25/00* (2006.01)
  *H03F 3/213* (2006.01)

(52) U.S. Cl.
  CPC ............ *H01L 25/50* (2013.01); *H03F 3/213* (2013.01); *H03F 2200/451* (2013.01)

(56) References Cited

U.S. PATENT DOCUMENTS

| | | |
|---|---|---|
| 9,866,646 B2 | 1/2018 | Chandhok et al. |
| 9,899,292 B2 | 2/2018 | Chiu et al. |
| 10,375,833 B2 | 8/2019 | Viswanathan et al. |
| 11,128,268 B1 | 9/2021 | Kishore et al. |
| 11,342,275 B2* | 5/2022 | Wei .................. H01L 21/56 |
| 2005/0001294 A1 | 1/2005 | Li et al. |
| 2007/0045822 A1 | 3/2007 | Diaz et al. |
| 2007/0114611 A1 | 5/2007 | Chidambarrao et al. |
| 2008/0157302 A1 | 7/2008 | Lee et al. |
| 2010/0148357 A1 | 6/2010 | Yang et al. |
| 2016/0254217 A1 | 9/2016 | Lu et al. |
| 2016/0285418 A1* | 9/2016 | Jones .................. H01L 28/10 |
| 2016/0365306 A1 | 12/2016 | Lu et al. |
| 2017/0127523 A1 | 5/2017 | Fritz et al. |
| 2018/0270960 A1 | 9/2018 | Mswanathan et al. |
| 2020/0067460 A1 | 2/2020 | Szymanowski et al. |
| 2021/0328552 A1 | 10/2021 | Tucker et al. |
| 2021/0336585 A1 | 10/2021 | Mares et al. |
| 2021/0375525 A1 | 12/2021 | Kao et al. |
| 2021/0408978 A1* | 12/2021 | Chidurala ................ H03F 1/56 |
| 2022/0084950 A1* | 3/2022 | Noori .................. H01L 23/5386 |
| 2022/0130768 A1* | 4/2022 | Wei .................. H01L 23/49562 |
| 2023/0006708 A1* | 1/2023 | Nakagawa ............... H04B 1/40 |
| 2023/0130259 A1* | 4/2023 | Haba ....................... H01L 23/66 343/841 |
| 2023/0140612 A1* | 5/2023 | Joshi ....................... H03F 3/60 327/551 |

OTHER PUBLICATIONS

U.S. Appl. No. 16/851,895; 48 pages, (filed Apr. 17, 2020).
U.S. Appl. No. 16/857,134; 47 pages, (filed Apr. 23, 2020).
U.S. Appl. No. 17/077,583; not yet published; 54 pages, (filed Oct. 22, 2020).
U.S. Appl. No. 17/659,379, filed Apr. 15, 2022; Notice of Allowance dated Jan. 30, 2023; 19 Pages.
U.S. Appl. No. 17/659,379; Inventors: Yun Wei et al.; "Methods of Fabricating Leadless Power Amplifier Packages Including Topside Terminations".

* cited by examiner

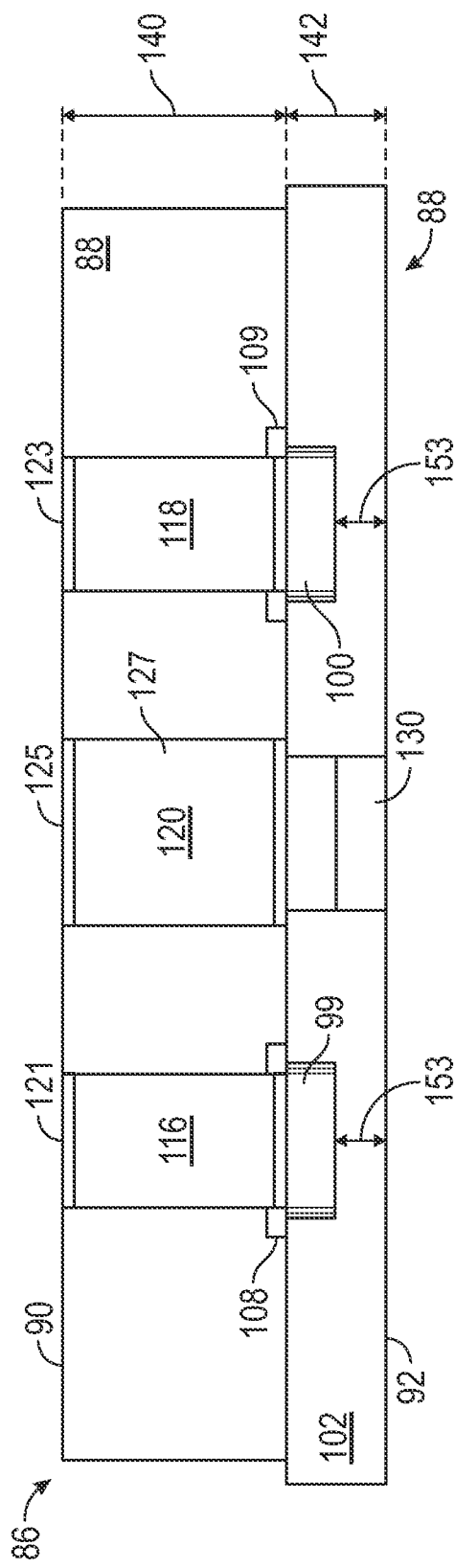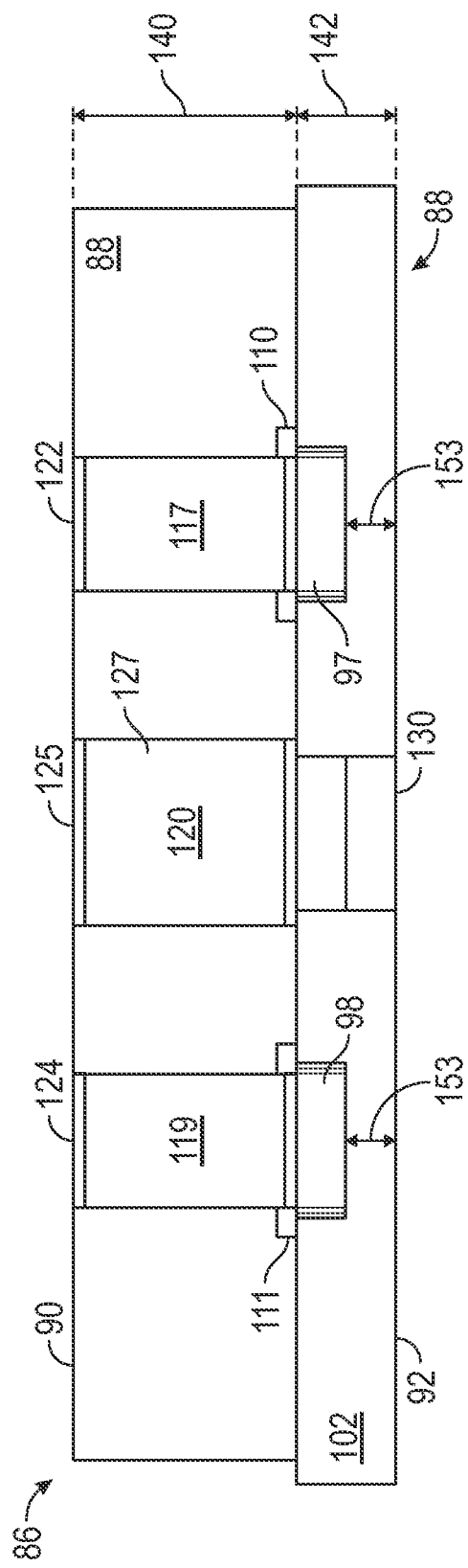

LEADLESS POWER AMPLIFIER PACKAGES INCLUDING TOPSIDE TERMINATION INTERPOSER ARRANGEMENTS AND METHODS FOR THE FABRICATION THEREOF

TECHNICAL FIELD

Embodiments of the present disclosure relate generally to microelectronics and, more particularly, to leadless power amplifier (PA) packages and methods for fabricating leadless PA packages having topside termination interposer arrangements.

BACKGROUND

A power amplifier (PA) package contains at least one semiconductor die bearing a transistor integrated circuit, which is utilized for radio frequency (RF) signal or power amplification purposes; herein, an "RF power die." In the case of a Doherty PA package, for example, at least one carrier RF power die and at least one peaking RF power die are contained within the body of the PA package. The carrier and peaking RF power dies may be mounted to an electrically-conductive substrate, such as a metallic base flange, which provides electrical contact to the respective backsides of the dies, while also potentially serving as a heatsink aiding in the dissipation of excess heat generated during operation of the RF power dies. In certain cases, the PA package may include a lid or cover piece enclosing an air cavity; the term "air cavity" referring to a sealed, gas-containing cavity by industry convention. In other instances, a PA package may be fabricated to lack such an air cavity and, instead, to contain a void-free encapsulant body in which the packaged RF power dies, any other packaged microelectronic components (e.g., surface mount devices), and wirebonds or other interconnect features are embedded. PA package of this latter type are commonly referred to as "encapsulated," "overmolded," or "plastic" packages, with the term "overmolded" principally used herein. As indicated above, the RF power die or dies contained within a PA package may be prone to excess heat generation during operation, particularly in the case of carrier RF power dies operated at higher radio frequencies (e.g., approaching or exceeding 3 Gigahertz) and dies fabricated utilizing a power dense technologies, such as layered gallium nitride die structures. If not adequately dissipated, such excess heat can accumulate within the PA package and limit performance of the RF power dies.

BRIEF DESCRIPTION OF THE DRAWINGS

At least one example of the present invention will hereinafter be described in conjunction with the following figures, wherein like numerals denote like elements, and:

FIGS. 5 and 6 are opposing side views of the example leadless PA package shown in FIGS. 2-4, with the overmolded package body shown in outline;

Figure 1:
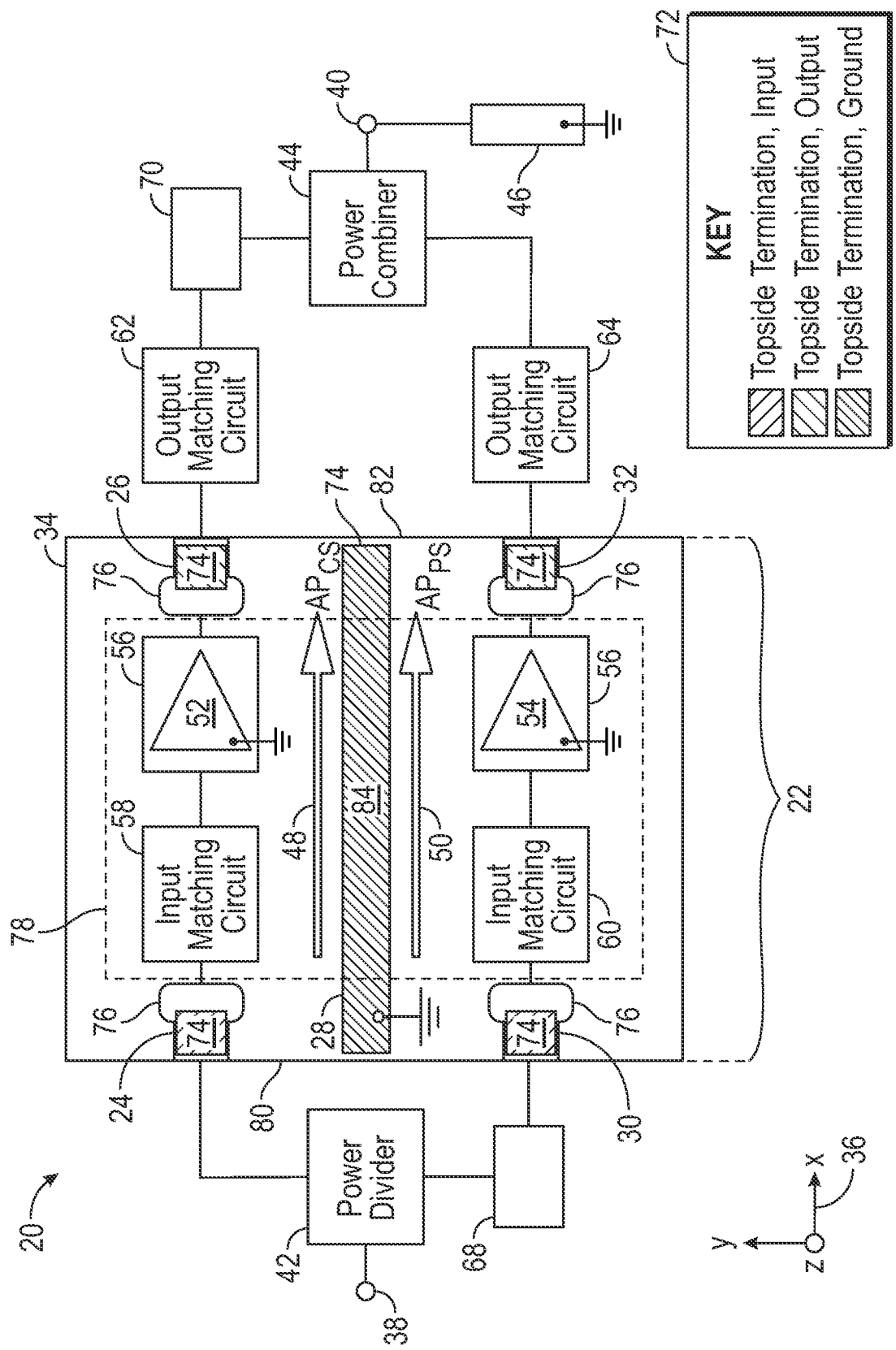
FIG. 1 schematically illustrates a multiple-path amplifier circuit (here, a two way Doherty amplifier circuit), portions of which may be implemented utilizing a leadless power amplifier (PA) package containing a topside termination interposer (TTI) arrangement in accordance with example embodiments of the present disclosure.
Figure 2:
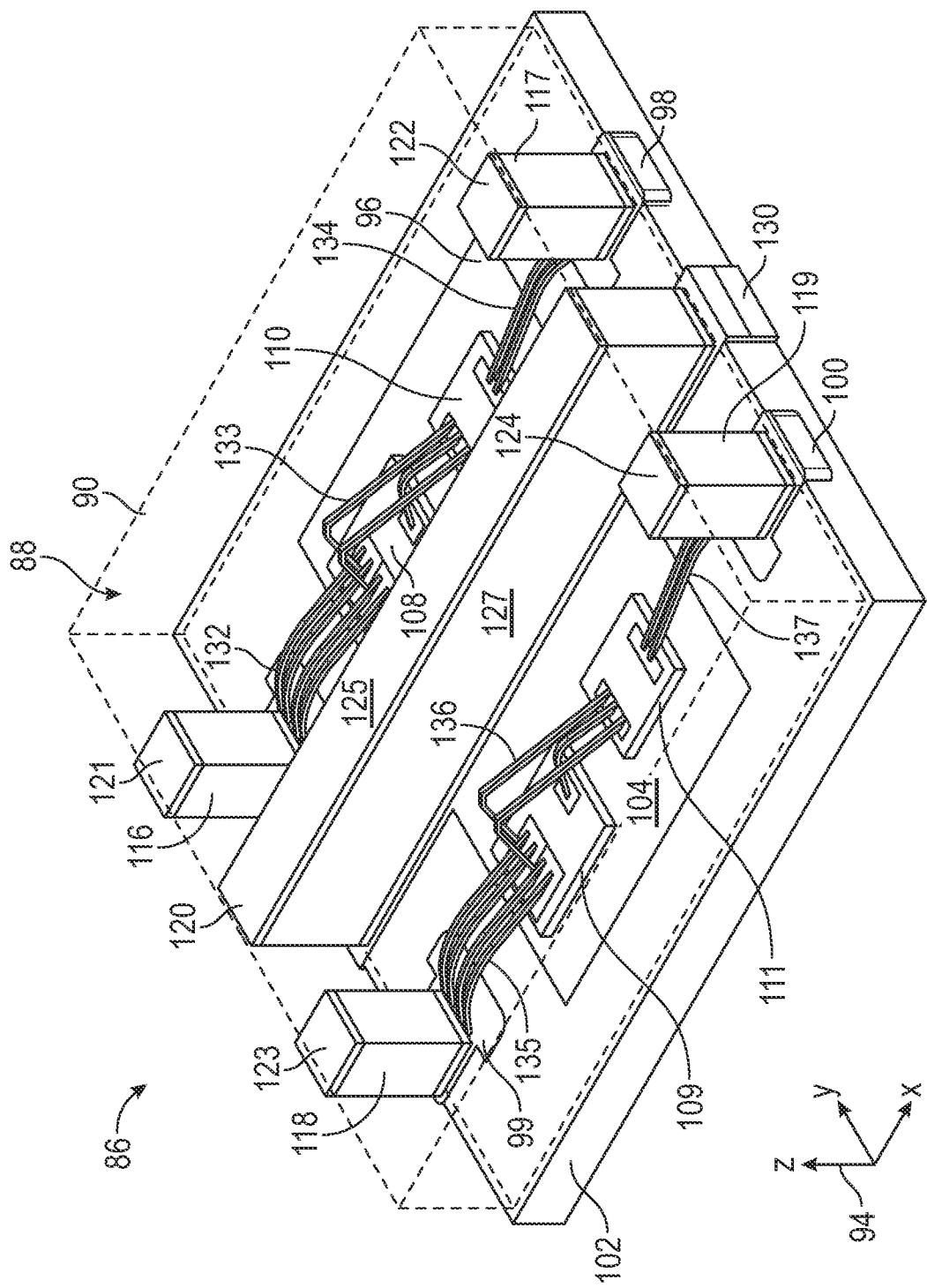
FIG. 2 is an isometric view of a leadless PA package including a topside input/output interface, an overmolded package body (shown in phantom line), and a TTI arrangement, as illustrated in accordance with an example embodiment of the present disclosure.
Figure 3:
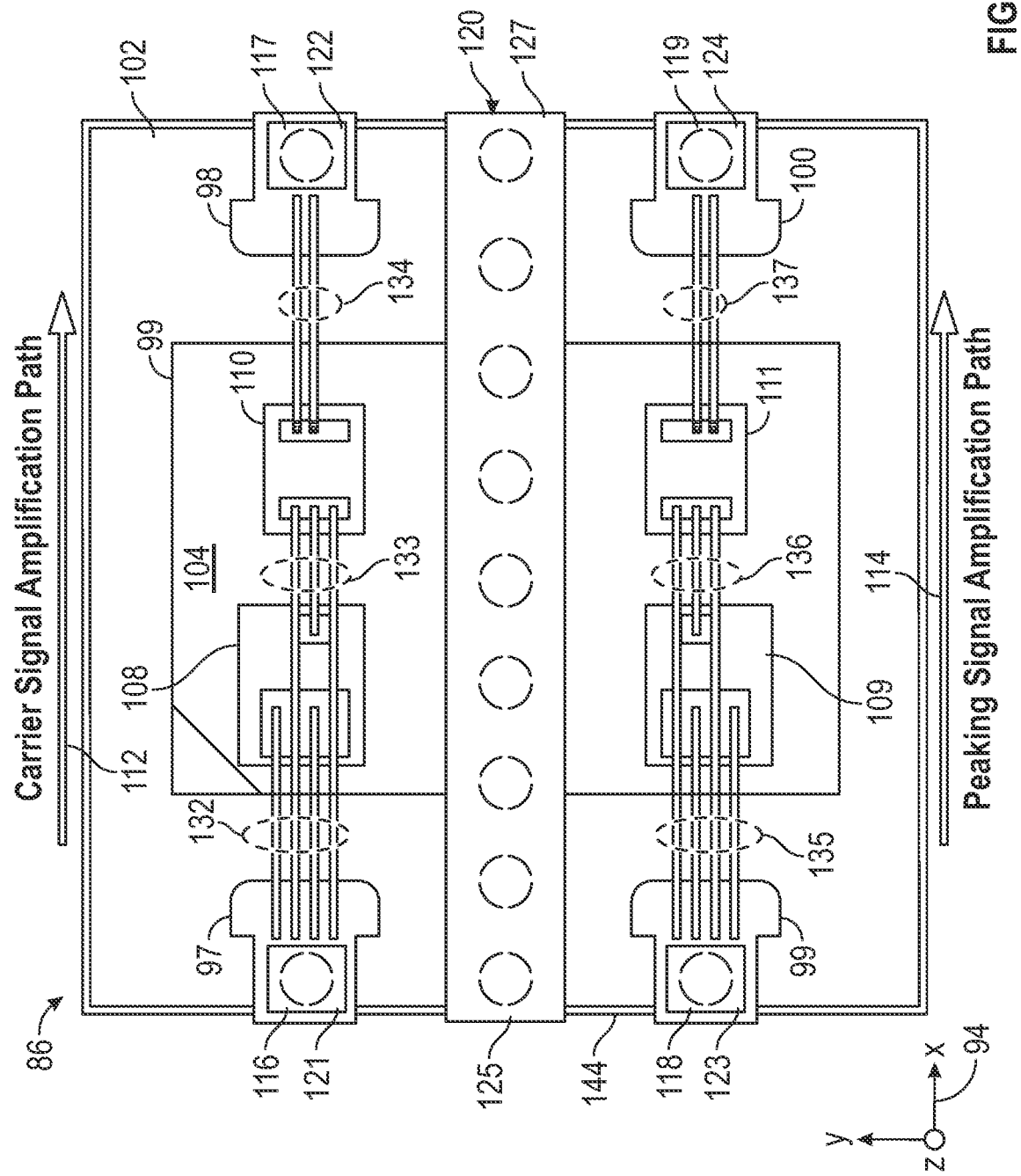
FIGS. 3 and 4 are topside and bottomside views, respectively, of the example leadless PA package shown in FIG. 2, with the overmolded package body hidden from view.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

The term "integrated circuit die" or "IC die," as appearing herein, encompasses integrated passive devices, metal-oxide-semiconductor capacitor devices, and other such circuit elements, which are formed on discrete, semiconductor material-containing die; as well as semiconductor material-containing dies containing more complex active integrated circuits, such as transistor amplifier circuits of the type described below. As also appearing herein, term "metallic" refers to a material predominately composed of one or more metals, by weight percentage. Similarly, a named metal refers to a metallic material predominately composed of the named metal by weight. As an example, the term "copper" refers to a metallic material predominately composed of copper (Cu), by weight percentage.

As still further appearing herein, the term "topside termination interposer arrangement" or "TTI arrangement" refers to one or more discrete interposer structures or pieces, which are contained in a power amplifier (PA) package. The interposer piece or pieces making-up of a given TTI arrangement provide interconnection between a topside input/output (I/O) interface of the PA package and circuitry contained within the PA package. Whether provided as a single, more expansive interposer piece or as any number of smaller, separately-fabricated interposer pieces, the TTI arrangement includes upper and lower interposer bond pads. In many instances, the upper interposer bonds are exposed at the topside surface of the PA package (that is, the outer principal surface of the PA package located opposite a base structure, such as a base flange and interposer mount pads, contained within the PA package) to define some, if not all of the terminals included in the topside I/O interface of the PA package.

Overview

The following describes PA packages and methods for fabricating leadless PA packages including topside I/O interfaces and other unique features, such as bottomside thermal interfaces. For a given embodiment of the leadless PA package, the topside I/O interface may include terminals substantially coplanar with, or perhaps slightly recessed or raised relative to, the package topside surface. The PA package contains one or more interposer pieces, which form a topside termination interposer (TTI) arrangement electrically interconnecting conductive elements included in a base structure of the PA package (e.g., a flange and interposer mount pads) to terminals included in the topside I/O interface. For example, in certain embodiments, the TTI arrangement may consist of a single interposer piece, which spans various internal portions of the PA package to provide the desired electrical connections; e.g., any number of signal input, signal output, and electrical ground connections. In this case, the TTI arrangement may have, or encompass, an I-shaped geometry as viewed looking downwardly on the TTI arrangement and which includes a central section serving as a central isolation wall of the type discussed below. In other implementations, the TTI arrangement may be produced from multiple, discrete interposer pieces, which may be placed in close proximity (e.g., an abutting relationship) within the PA package or which may be spaced apart and distributed throughout the internal layout of the PA package. Generally, then, the TTI arrangement contained within a given PA package can contain a single interposer piece of any suitable size and shape; or various combinations of multiple interposer pieces, which may be positioned, arranged, or assembled in a wide range of manners to provide a high level of flexibility in PA package design.

In addition to the above-described TTI arrangement, embodiments of the PA package further include a package bottomside surface located opposite the package topside surface, as taken along an axis extending orthogonal to a die mount surface of the base flange (also referred to herein as the "package height direction"). Such terms of orientation are utilized in a relative sense, with terms such as "upper," "topside," "lower," and "bottomside" defined in view of respective proximity to the package base flange (or similar die-supporting substrate), noting that a given leadless PA package can function in any orientation in three dimensional space. In this latter regard, embodiments of the leadless PA package may be mounted in an inverted orientation when installed on an electrically-routed assembly-level substrate, such as a motherboard or another printed circuit board (PCB), included in a larger microelectronic system or assembly. Further, embodiments of the leadless PA package are conveniently fabricated as a flat no-lead package; that is, a leadless package having a substantially planar topside surface with which the terminals or contact pads of the topside I/O interface are generally coplanar or flush, again noting that the topside terminals or upper interposer pads may be slightly recessed or raised relative to the topside surface; e.g., due to plating of the exposed contact surfaces following a planarization or back-grinding step. Examples of such flat no-lead packages include dual flat no-lead (DFN) packages or quad flat no-lead (QFN) packages. This stated, embodiments of the leadless PA package can possess various leadless form factors, providing the PA package includes a topside I/O interface and, perhaps, a bottomside thermal interface for extracting excess heat from the PA package, as further discussed below.

Embodiments of the leadless PA packages are beneficially fabricated to contain Doherty PA architectures and are principally described below as such. Embodiments of the leadless PA package can be fabricated to possess other PA architectures, however, providing the PA package contains at least one transistor-bearing, radio frequency (RF) power die utilized for power or signal amplification purposes. Further, in embodiments, the leadless PA package may contain additional circuitry in addition to a transistor integrated circuit (IC) or ICs, which serve as the amplifier section or sections of the PA package. Such additional circuitry can be realized utilizing discrete microelectronic components, such as surface mount devices (SMDs), further contained within the leadless PA package; and/or, perhaps, utilizing a small PCB (or similar electrically-routed substrate) further embedded in the PA package. More commonly, however, such additional circuitry (when contained in a given instance of the PA package) is formed on discrete IC dies, which are further contained in the leadless PA package and mounted to a supportive surface or "die mount surface" of a base flange; although, in certain cases, it is also possible for such additional circuitry to be formed on a common die with single state or multi-stage amplifier circuitry. Accordingly, in various implementations, additional IC dies may be contained in a given instance of the leadless PA package and carry or bear IC features, which provide any combination of input and/or output impedance matching, transistor biasing, harmonic termination, and other such functions. Generally, then, embodiments of the leadless PA package may be described as containing one or more IC dies, with at least one of the IC dies (and often at least two of the IC dies) assuming the form of an RF power die. In the case of a Doherty PA architecture, specifically, the packaged IC dies will often include at least one peaking RF power die and at least one carrier RF power die, which are positioned in parallel amplification paths in the form of peaking and carrier signal amplification paths extending in parallel within the leadless PA package.

To support formation of the topside I/O interface, a given PA package may include a base structure onto which other components of the PA package (e.g., the topside termination interposers) are assembled during PA package fabrication. Such a base structure may include or assume the form of a base flange and interposer mount pads in embodiments. In such embodiments, the interposer mount pads are spaced from the base flange in one or more directions taken in a die mount plane, which is coplanar with the die mount surface of the base flange. For manufacturing efficiency, the base flange and interposer mount pads may be initially provided as a leadframe having sacrificial leadframe portions (e.g., including tie bars, spars, or the similar connective sections), which physically interconnect the base flange and interposer mount pads during a majority of the manufacturing process stages. The sacrificial portion of the leadframe is subsequently removed during singulation to electrically isolate the base flange and interposer mount pads following formation of the PA package body. Further, such a leadframe may be included in a larger a leadframe array, which contains a relatively large number of interconnected leadframes and which is globally processed to produce a number of leadless PA packages in parallel. While it is possible for instances of the leadless PA package to be fabricated as an air cavity package in embodiments, the leadless PA package will often be produced as an overmolded or encapsulated package containing an overmolded package body. In this latter case, the leadframe array may be encapsulated in an overmold panel following the performance of certain processing steps (described below), with the overmold panel and the leadframe array (jointly, the "overmolded leadframe array") then subject to a concurrent singulation process. Singulation of the overmolded leadframe array yields a plurality of PA packages, each containing an overmolded package body formed from a singulated piece of the overmold panel and singulated pieces of the leadframe (e.g., a base flange and interposer mount pads) embedded in the overmolded package body.

During an example PA package fabrication process, the base structure (e.g., the base flange and interposer mount pads) is initially placed on the upper surface of a carrier, a work bench, or a similar temporary support surface. As noted above, the base structure is conveniently, although non-essentially, provided in a leadframe format One or more IC dies, including at least one RF power die, are then attached to a die mount surface of the base flange. The IC dies and the interposer mount pads are electrically interconnected, as appropriate, by wirebonding or utilizing another interconnection approach. Next, the interposer piece or pieces forming the desired TTI arrangement are mounted to and electrically coupled the appropriate portions of the base structure; e.g., the interposer mount pads and the base flange. In this regard, the TTI arrangement may include one or more interposer pieces, each having electrically-insulative (dielectric) body, upper and lower interposer pads (e.g., formed as patterned or nonpatterned metallic layers), and vertically-extending conductors electrically coupling corresponding pairs or groupings of upper and lower interposer pads. As appearing herein, the term "vertically-extending conductors" refers to conductors oriented to extend principally in the package height direction within the PA package to interconnect upper and lower interposer pads. In many instances, the vertically-extending conductors may be formed as electrically-conductive vias extending within dielectric interposer body or bodies, with such vias having (e.g., Cu) plated internal surfaces, being filled with an electrically-conductive material, or otherwise containing an electrically-conductive material sufficiently distributed and dimensioned to provide the desired interconnection between upper and lower interposer pads. Comparatively, the dielectric body of a given interposer piece may be composed of a PCB material (e.g., FR-4), a ceramic, or another dielectric material. The dielectric body may be formed as non-layered monolithic structure (e.g., a ceramic or polymeric block), as a multi-layer (e.g., PCB) structure, or as any other structure capable of serving as a dielectric substrate on or in which the interposer pads, the vertically-extending conductors (e.g., vias), and any other electrically-conductive features of the interposer pieces are suitably formed.

As noted above, the interposer piece or pieces forming the desired TTI arrangement may be joined to the corresponding electrical contacts (e.g., interposer mount pads and base flange) of the base structure following die attachment In this regard, the lower contact pads of the TTI arrangement may be joined to the interposer mount pads and/or to the base flange, as appropriate, utilizing an electrically-conductive bonding material, such as an electrically-conductive die attach material, solder, or a sintered bonding material, examples of which are described below. In one approach, an electrically-conductive bond material (e.g., a metal particle-containing paste) is printed or otherwise applied to selected portions of the lower interposer pads or target mount locations on the interposer mount pads and base flange, the interposer piece or pieces making-up the TTI arrangement are then placed in desired positions utilizing a pick-and-place tool, and curing is conducted to complete the electrical and mechanical bonding process. The package topside surface is defined subsequent to positioning of the TTI arrangement by formation of the package body; that is, a material body, structure, or assembly enclosing the IC dies and any other electrically-active components contained in the PA package.

Embodiments of the leadless PA packages are readily fabricated as an overmolded or encapsulated package, which includes an overmolded package body in which the IC dies, the interposer mount pads, the TTI arrangement, and the base flange are embedded. In this case, in embodiments in which multiple PA packages are fabricated in parallel, the overmolding process may be carried-out to create a relatively large overmold panel having an excessive thickness or overburden covering the upper interposer pads. Afterwards, the overmold panel may be thinned utilizing a material removal process, such as back-grinding, to expose the upper interposer pads and at least partially define the topside package surface of the molded package body. Exposed through the topside package surface in this manner, the upper interposer pads form topside I/O terminals included in the package topside I/O interface. In certain embodiments, electroplating may then be carried-out to deposit a plating finish on the topside I/O terminals, which may include the exposed surfaces of the upper interposer pads. When the leadless PA package is produced in parallel with a plurality of additional PA packages, an electroplating process may be carried-out by applying an electrical potential to the interposer mount pads and to the TTI arrangement through the leadframe array. In this manner, a desired plating layer or multi-layer plating system can be readily deposited onto the terminals of topside I/O interface without requiring additional processing steps, such as the deposition of solder balls, in at least some implementations of the present disclosure. Singulation is then carried-out to separate the leadframe array and the molded panel into a plurality of discrete leadless PA packages, each including a topside I/O interface.

As discussed more fully below, the interposer pieces contained in the TTI arrangement conduct input and output signals, such as gate and drain signals in the case of FET-based PA circuits, from the topside I/O interface of the leadless PA package to the circuitry contained therein. The TTI arrangement may also provide connection between the packaged circuitry and a current return or ground contact included in the topside I/O interface, which may be a source contact in the case of many FET-based PA circuits. Other circuitry, such as harmonic termination circuits or bias circuits, can also be contained in a given PA package, perhaps partially or wholly formed within the interposer pieces themselves in embodiments, with the TTI arrangement providing appropriate electrical connections to such circuitry. Additionally, in certain embodiments, one or more topside termination interposers contained in the TTI arrangement may contain grounded or floating electrical conductors sized and positioned for electromagnetic (EM) isolation or shielding purposes. For example, in this latter regard, embodiments of TTI arrangement may include a central isolation wall, which extends between separate signal amplification paths within a given leadless PA package. Such a central isolation wall may be composed of a dielectric material (e.g., a PCB material or a ceramic) in which or on which vertical electrical interconnections, such as bar vias or vias arranged in any number of rows, are formed. When the PA package contains a metallic base flange, the central isolation wall may be electrically coupled to the base flange by, for example, attaching the lower interposer pad or pads of the central isolation wall to the base flange utilizing an electrically-conductive (e.g., sintered) bonding material. The base flange may, in turn, be electrically coupled to ground terminals included in the packaged RF power dies; e.g., in the case of a Doherty amplifier architecture, peaking and carrier RF power dies may be electrically coupled to the base flange utilizing an electrically-conductive bonding material. Consequently, in such embodiments, electrical connection to the ground terminals (e.g., bond pads) of the carrier and peaking RF power dies is provided through the base flange, through the electrically-conductive regions (e.g., embedded vias) of the central isolation wall, and to a ground terminal included in the topside I/O interface.

In embodiments in which the leadless PA package is imparted with a Doherty amplifier architecture or layout and the TTI arrangement contains a central isolation wall (whether provided as a discrete interposer piece or as a section of a larger interposer piece), peaking and carrier RF power dies may be positioned on opposing sides of the central isolation wall. Any additional packaged circuit elements or sections included in the peaking and carrier signal amplification paths may also be positioned on opposing sides of the central isolation structure when such additional circuit elements are contained in the PA package. For example, any number of impedance matching networks can be realized utilizing discrete IC dies, which may be deployed on opposing sides of the central isolation wall for reduced EM coupling between the amplifier signal paths to enhance RF performance characteristics of the PA package. Additionally or alternatively, the central isolation wall may be dimensioned to span a majority, if not the substantially entirety of the PA package body in a given direction, such as a lengthwise direction in which the central isolation wall is elongated. Accordingly, embodiments of the central isolation wall may include a first end portion, which terminates at or adjacent a first sidewall of the package body and which is positioned between a first pair of TTI arrangement (e.g., two input TTI arrangement spaced along a first edge of the PA package); an intermediate portion, which extends between and partitions IC dies located in different signal amplification paths (e.g., segregating peaking and carrier RF power dies in the case of a Doherty layout); and a second, opposing end portion, which terminates at or adjacent a second, opposing sidewall of the package body and which is positioned between a second pair of the TTI arrangement (e.g., two output TTI arrangement spaced along a second edge of the PA package).

In the above-described manner, PA packages can be fabricated to have compact, leadless form factors and enhanced isolation capabilities utilizing a cost effective, streamlined, reliable manufacture process. As a still further benefit, embodiments of the PA packages may provide enhanced thermal performance through the inclusion of unique bottomside thermal interfaces. As appearing herein, the term "bottomside thermal interface" refers to an externally-accessible interface exposed along the bottomside surface of the leadless PA package through which excess heat can be readily extracted from the body of the leadless PA package and, specifically, from locations adjacent one or more heat-generating components (e.g., one more RF power dies) within the PA package. The bottomside thermal interface may be, for example, a lower principal surface of a metallic base flange or other substrate (e.g., a small PCB with coining or a coreless substrate), which is exposed at and may be substantially coplanar with the bottomside of the PA package. When the PA package is installed within a larger electronic assembly or system, the bottomside thermal interface may be left exposed (uncovered) to allow convective heat transfer to the ambient environment More usefully, however, the bottomside thermal interface may be thermally coupled to an assembly-level heatsink when the PA package is installed within a larger electronic assembly to further promote excess heat outflow from the PA package and dissipation of the excess heat to the ambient environment. Such an assembly-level heatsink can be, for example, a fin array, a metal chassis, or another thermally-conductive structure suitable for absorbing excess heat extracted from the PA package and convectively transferring or releasing excess heat to the surrounding environment Electrical connections are further formed between the topside I/O interface of the PA package and an assembly-level substrate, such as a motherboard, to which the PA package is mounted in an inverted orientation when the PA package is installed within a larger electronic assembly or system. Thus, in a general sense, heat may be conductively extracted from the PA package in a first general direction (through the bottomside thermal interface), while electrical signals are exchanged with the PA package in a second, opposing direction through the topside I/O interface.

Considering the enhanced thermal performance and isolation capabilities provided by embodiments of the present disclosure, the presently-disclosed leadless PA packages are well-suited for usage in applications benefiting from improved reliability, minimized system costs, reductions in radio volume, and greater thermal dissipation, such as massive multiple input/multiple output (mMIMO systems). The PA packages are also well-suited for usage in conjunction with high power density die technologies often prone to excess heat generation, particularly when utilized to fabricate the carrier RF power die in the case of a Doherty PA architecture. Examples of such high performance dies include layered base die structures, such as layered Gallium Nitride (GaN) structures and layered Gallium Arsenide (GaAs) structures; and IC dies fabricated utilizing certain high electrical resistance substrates, such as high resistance bulk silicon (Si) substrates, silicon-on-insulator (SOI) substrates, and diamond-based and glass-based substrates. A first example leadless PA package having a topside I/O interface and other unique features (e.g., a central isolation wall) will now be described in conjunction with FIGS. 1-10, while example methods for fabricating such a PA package in conjunction with a plurality of similar or identical PA packages is further discussed below in connection with FIGS. 11-14. One manner in which the leadless PA package shown in FIGS. 2-8 may be installed within a larger electronic assembly or system in an inverted orientation is discussed below in connection with FIG. 15. Following this, several alternative embodiments of TTI arrangements suitable for incorporation into leadless PA packages are discussed below in connection with FIGS. 16-27.

General Discussion of Leadless Power Amplifier Packages Including Topside Termination Interposer Arrangements FIG. 1 is a schematic diagram of a Doherty PA circuit 20, as illustrated in accordance with an example embodiment of the present disclosure. One or more portions of Doherty PA circuit 20 may be provided in the form of a PA package, such as PA package 22 generically outlined in FIG. 1. Leadless PA package 22 may be produced to include a leadless topside I/O interface 24, 26, 28, 30, 32, with surfaces of the various terminals or contacts included in topside I/O interface 24, 26, 28, 30, 32 exposed at a topside package surface of PA package body 34 of PA package 22; e.g., an outer principal surface of PA package body 34, which may (but need not necessarily) having a substantially planar or "flat" topology generally extending in the X-Y plane of coordinate legend 36. In the present example, specifically, leadless PA package 22 is realized as a DFN package having a first set of input terminals 24, 30; a second set of output terminals 26, 32; and at least one ground terminal 28. In further embodiments, leadless PA package 22 can be fabricated to have other topside I/O interface layouts and assume various other form factors depending on, for example, the number and type of microelectronic components (principally, IC dies) contained within PA package body 34, the package component layout and interconnection scheme employed, and other design factors. Additional description of example realizations of PA package 22 is set-forth below. First, however, Doherty PA circuit 20 is described in greater detail to provide an illustrative, non-limiting context in which embodiments of PA package 22 may be better understood.

In the illustrated example, Doherty PA circuit 20 includes an input node 38, an output node 40, and a power divider 42 (or splitter) between nodes 38, 40. Doherty PA circuit 20 further includes a carrier (main) signal amplification path and at least one peaking (auxiliary) signal amplification path. Power divider 42 is configured to divide the power of an input RF signal received at input node 38 into carrier and peaking portions, which are directed along the carrier and peaking signal amplification paths, respectively. The carrier and peaking signal amplification paths extend in parallel until subsequent recombination at a power combiner 44, which is electrically coupled to circuit output node 40. As identified by a first arrow 48 labeled "$AP_{CS}$" in FIG. 1, a portion of the carrier signal amplification path extends through leadless PA package 22. Similarly, as identified by a second arrow 50 labeled "$AP_{PS}$," a portion of the peaking signal amplification path likewise extends through PA package 22 in parallel with the carrier signal amplification path (arrow 48). During operation of the larger assembly or system in which Doherty PA circuit 20 is installed, an electrical load 46 is coupled to circuit output node 40 directly or through any number of additional circuit elements (e.g., a non-illustrated impedance transformer). Doherty PA circuit 20 is well-suited for incorporation in a larger, non-illustrated PA system, such as a cellular base station or other wireless communication system, with load 46 receiving an amplified RF signal from Doherty PA circuit 20 for subsequent over-the-air radiation via an antenna array.

Leadless PA package 22 contains a carrier amplifier 52 positioned in the carrier signal amplification path 48 and a peaking amplifier 54 positioned in the peaking signal amplification path 50. Amplifiers 52, 54 each include at least one power transistor IC for amplifying RF signals conducted through amplifiers 52, 54. The power transistor ICs may be fabricated on semiconductor dies 56, 57 and imparted with a single-stage or multi-stage configuration. In embodiments, all amplifier stages (or a final amplifier stage) of either or both of amplifiers 52, 54 may be implemented utilizing any of the following transistor technologies: a silicon-based field effect transistor (e.g., a laterally-diffused metal oxide semiconductor FET or LDMOS FET) or a III-V FET (e.g., a gallium nitride (GaN) FET, a gallium arsenide (GaAs) FET, a gallium phosphide (GaP) FET, an indium phosphide (InP) FET, or an indium antimonide (InSb) FET, or another type of III-V transistor). The carrier and peaking transistor ICs may be equally sized when, for example, Doherty PA circuit 20 has a symmetric configuration. Alternatively, the carrier and peaking transistor ICs may have unequal sizes in the case of various asymmetric Doherty configurations; it being understood that the term "size," as appearing in this context, is utilized in reference to the active periphery or total active gate width of the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than 2:1 may be implemented, as well. To reflect the fact that FETs are predominately utilized in the production of PA devices, the foregoing paragraph and this document, as a whole, principally focus on implementations of the (e.g., Doherty) PA devices implemented utilizing FETs. In alternative embodiments of the present disclosure can be implemented utilizing other transistor types, however, including bipolar transistors. Generally, then, embodiments of the present disclosure are not restricted to usage in conjunction with any particular transistor type or die technology.

Carrier amplifier 52 of Doherty PA circuit 20 may be biased to function in class AB mode during circuit operation, while peaking amplifier 54 is biased to function in class C mode. At low power levels (e.g., when the power of the input signal applied to input node 38 is less than the turn-on threshold level of peaking amplifier 54), Doherty PA circuit 20 operates in a low-power or back-off mode. In the low-power (back-off) mode, carrier amplifier 52 may be only amplifier supplying current to load 46. When the power of the input signal exceeds a threshold level of peaking amplifier 54, however, Doherty PA circuit 20 transitions to operation in a full-power or high power mode in which carrier amplifier 52 and peaking amplifier 54 supply current to load 46 concurrently. At this point, peaking amplifier 54 provides active load modulation at power combiner 44, allowing a continued, substantially linear increases in the current output of carrier amplifier 52. Also, as Doherty PA circuits 20 operates in the full-power mode during which amplifiers 52, 54 concurrently supply current to load 46, power divider 42 apportions the input signal power between the signal amplification paths accordingly. When Doherty PA circuit 20 is imparted with a symmetric Doherty PA configuration, power divider 42 may apportion power in a substantially equivalent manner, such that approximately one half of the input signal power is provided to each signal amplification path (arrows 48, 50). In other instances, such as when Doherty PA circuit 20 is imparted with an asymmetric Doherty PA configuration, power divider 42 may be configured to apportion power unequally between the signal amplification paths (arrows 48, 50). Essentially, then, power divider 42 divides an input RF signal supplied at input node 38, with the divided signal portions then separately amplified along the carrier or "main" signal amplification path (arrow 48) and the peaking or "auxiliary" signal amplification path (arrow 50).

In the illustrated example, Doherty PA circuit 20 further includes two input impedance matching circuits or networks 58, 60 and two output impedance matching circuits or networks 62, 64. Matching networks 58, 60, 62, 64 may serve to incrementally increase the circuit impedance toward the load impedance or the source impedance, as appropriate. In certain implementations, matching networks 58, 60, 62, 64 may each be implemented inside PA package 22, in whole or in part. For example, as indicated in FIG. 1, and in the corresponding examples described below in connection with FIGS. 2-14, input matching networks 58, 60 may be contained in PA package 22; e.g., input impedance matching network 58 may implemented on a discrete IC die contained in PA package 22 and positioned on a first side (the "carrier side") of a central isolation structure or wall (e.g., central isolation wall 84 included in a TTI arrangement 74, as described below). Comparatively, input impedance matching network 60 is likewise implemented on a discrete IC die further contained in PA package 22 and positioned on a second, opposing side (the "peaking side") of the central isolation wall 84. Comparatively, in such implementations, output impedance matching networks 62, 64 may be implemented on a printed circuit board (PCB) or another assembly-level substrate to which PA package 22 is mounted, with networks 62, 64 implemented utilizing any combination of IC dies, surface mount devices (SMDs), or circuit elements formed in the assembly-level PCB itself. In other instances, all, none, or a different subset of matching networks 58, 60, 62, 64 may be integrated into PA package 22. A large degree of design flexibility is thus afforded in implementing PA package 22 and Doherty PA circuit 20, generally. Further, either or both of power amplifiers 52, 54 may be implemented with multiple parallel amplification paths (rather than with a single amplification path) in more complex embodiments. For example, in an example asymmetric Doherty configuration, carrier amplifier 52 may be implemented with two (or a greater number of) parallel amplification paths, while peaking amplifier 54 is implemented with three (or some other number of) parallel amplification paths. Further, in the case of an N-way Doherty amplifier (N>2), PA package 22 may contain multiple peaking amplifiers of differing configurations or levels.

In the relatively simple example of FIG. 1, Doherty PA circuit 20 has a standard load network configuration. Accordingly, the input-side circuit portion is configured such that an input signal supplied to peaking amplifier 54 is delayed by 90 degrees with respect to the input signal supplied to carrier amplifier 52 at the center frequency of operation of, for example, Doherty PA circuit 20. To ensure arrival of the carrier and peaking input RF signals at amplifiers 52, 54 with approximately 90 degrees of phase shift, a first phase delay element 68 may be incorporated into Doherty PA circuit 20 to provide about 90 degrees of phase delay to the peaking input signal. For example, phase delay element 68 may include a quarter wave transmission line, or another suitable type of delay element, with an electrical length of about 90 degrees. To compensate for the resulting 90 degree phase delay difference between the carrier and peaking amplification paths (arrows 48, 50) at the inputs of amplifiers 52, 54, and thereby ensure that the amplified signals arrive in phase at power combiner 44, the output-side circuit portion is similarly configured to apply about a 90 degree phase delay to the signal between the output of carrier amplifier 52 and power combiner 44. This may be achieved through the provision of an additional phase delay element 70. While Doherty PA circuit 20 has a standard load network configuration in the illustrated embodiment, other load network configurations are possible in other implementations. For example, in alternative implementations, Doherty PA circuit 20 may instead have an alternate (or "inverted") load network configuration. In this case, the input-side circuit portion may be configured such that an input signal supplied to carrier amplifier 52 is delayed by about 90 degrees with respect to the input signal supplied to peaking amplifier 54 at the center frequency of operation of Doherty PA circuit 20. Correspondingly, the output-side circuit portion may be configured to apply about a 90 degree phase delay to the signal between the output of peaking amplifier 52 and power combiner 44.

As previously indicated, leadless PA package 22 is fabricated to include a topside I/O interface 24, 26, 28, 30, 32. Further, as indicated by a key 72 appearing in the lower right of FIG. 1, topside I/O interface 24, 26, 28, 30, 32 may include the following "terminations" or terminals: (i) input terminals 24, 30; (ii) output terminals 26, 32; and (iii) at least one central ground terminal 28. The terminals of topside I/O interface 24, 26, 28, 30, 32 are accessible from the package topside surface of leadless PA package 22 facilitating installation of PA package 22 in a larger electronic system or assembly utilizing various surface mount approaches, as further discussed below in connection with FIG. 15. Terminals 24, 26, 30, 32 are defined by exposed upper metal layers or contact pads of a number of interposer pieces collectively forming a TTI arrangement 74. Each interposer piece contained in TTI arrangement 74 extends from interposer mount pads 76 in the package height direction (corresponding to the Z-axis of coordinate legend 36). The interposer pieces may each be produced as multi-layer PCBs, dielectric (e.g., ceramic) blocks containing embedded electrical conductors, or similar structures, as discussed more fully below in connection with FIGS. 9 and 10. Comparatively, interposer mount pads 76 are at least partially composed of an electrically-conductive material and may be realized as metallic pieces in at least some implementations.

The interposer pieces contained in TTI arrangement 74 each include upper and lower electrically-conductive layers, which may be patterned to each define multiple pads or instead left as continuous, nonpatterned (e.g., metallic) layers. In either case, the upper electrically-conductive layers define a number of upper interposer pads, while the lower electrically-conductive layers define a number of lower interposer pads electrically coupled to interposer mount pads 76 and a base flange 78. The upper or outer terminal surfaces of the upper interposer pads may be exposed through the uppermost surface or frontside of PA package 22 to define topside I/O interface 24, 26, 28, 30, 32 in embodiments. Comparatively, the lower interposer pads of interposer pieces making-up TTI arrangement 74 are attached to interposer mount pads 76 and base flange 78 utilizing an electrically-conductive bonding material and, in certain cases, a sintered bonding material. Electrically-conductive paths are consequently created extending from the upper terminal surfaces of the upper interposer pads included in TTI arrangement 74 defining topside terminals 24, 26, 30, 32; through the interposer bodies; through the lower interposer pads; and to associated interposer mount pads 76. Interposer mount pads 76 are, in turn, electrically coupled to the appropriate terminals (e.g., bond pads) of IC dies contained in leadless PA package 22. Electrical interconnections are likewise formed between input matching networks 58, 60 and RF power dies 56, whether by wire-bonding or utilizing another interconnection technique; e.g., three dimensional printing techniques for creating conformal traces utilizing electrically-conductive inks.

With continued reference to the example embodiment of FIG. 1, TTI arrangement 74 includes four interposer pieces having upper interposer pads defining topside contacts or terminals 24, 26, 30, 32. These interposer pieces serve to conduct input and output signals between topside I/O interface 24, 26, 28, 30, 32 and the circuitry contained PA package 22 during operation of Doherty PA circuit 20. Additionally, TTI arrangement 74 also includes a fifth interposer piece, which has an upper interposer pad defining ground contact 28 and which serves as a central isolation wall 84. Central isolation wall 84 extends from a location at or adjacent the topside surface of PA package 22 in the package height direction (again, corresponding to the Z-axis of coordinate legend 36) toward a die attach surface of the above-mentioned base flange 78 further contained in PA package 22. Central isolation wall 84 thus provides an electrical path between the ground terminal of topside I/O interface 24, 26, 28, 30, 32 and base flange 78, which may be embedded in a lower portion of package body 34. Further, given the relatively expensive surface area of central isolation wall 66, as measured in the X-Y plane of coordinate legend 36, a relatively large surface area is availed for bonding and electrical conduction when PA package 22 is installed within a larger electronic system or assembly.

RF power dies 56 may further include ground terminals or bond pads, which are electrically coupled to base flange 78; e.g., by attaching RF power dies 56 to die mount surface of base flange 78 utilizing electrically-conductive bonding materials, such as sintered metallic (e.g., silver-containing bond layers). Robust electrical grounding paths are consequently formed extending from topside ground terminal 28 of PA package 22 (again, defined by the upper exposed, plated or non-plated surface of central isolation wall 84), through the body of central isolation wall 84, through base flange 78, and to the respective ground terminals of RF power dies 56 and the transistor IC circuits (the peaking and carrier amplifiers) integrated into RF power dies 56. Further, as can be seen in FIG. 1, the carrier RF power die 56 bearing carrier transistor IC 52 and the peaking RF power die 56 bearing peaking amplifier IC 54 are positioned on opposing sides of central isolation wall 84. As a grounded, electrically-conductive structure, central isolation wall 84 provides EM shielding between RF power dies 56 to reduce or eliminate undesired EM coupling between carrier transistor IC 52 and peaking amplifier IC 54. Further, as indicated in FIG. 1, central isolation wall 84 may extend from a location adjacent a first package sidewall 80 to a location adjacent a second, opposing package sidewall 82 of PA package 22. Central isolation wall 84 may thus span the substantial entirety of the lengths of signal amplification paths 48, 50; and, perhaps, a majority, if not the substantial entirety of the length of PA package 22, as measured along the X-axis of coordinated legend 36.

Central isolation wall 84 may be described as having a first end portion extending between the sections of TTI arrangement 74 defining the topside input terminals (here, the interposer pieces defining topside terminals 24, 30); a second end portion extending between extending between the sections of TTI arrangement 74 defining the topside output terminals (here, the interposer pieces defining topside terminals 26, 32); and an intermediate portion located between the first end portion and the second end portion, with the RF power die 56 bearing carrier amplifier 52 and the RF power die 56 bearing the peaking amplifier 54 located on opposing sides of the intermediate portion of the central isolation wall. By virtue of this positioning and dimensioning, central isolation wall 84 provides comprehensive EM shielding along the package length direction (corresponding to the X-axis of coordinate legend 36). Further, in the package height direction (corresponding to the Z-axis of coordinate legend 36), central isolation wall 84 may extends away from the die mount surface of base flange 78 and fully to the topside surface of PA package 22 in embodiments. Consequently, in such embodiments, central isolation wall 84 further provides EM isolation between topside terminals 24, 30 (and the corresponding interposer pieces or sections of TTI arrangement 74) located adjacent package sidewall 80, which are separated by the first intervening end portion of central isolation wall 84 as taken in a package width direction (corresponding to the Y-axis of coordinate legend 36). Similarly, central isolation wall 84 further provides EM isolation between topside terminals 26, 32 (and the corresponding interposer pieces or sections of TTI arrangement 74) separated by the second end portion of wall 84, as taken in the package width direction. Consequently, central isolation wall 84 provides EM shielding or isolation between the carrier signal amplification path (arrow 48) and the peaking signal amplification path (arrow 50) along the respective entireties or substantial entireties of these paths.

Turning now to FIGS. 2-8, an example implementation of a leadless PA package 22 (FIG. 1) is shown from a range of viewpoints and is referred to hereafter as "leadless PA package 86." In this particular example, leadless PA package 86 is fabricated as an overmolded or encapsulated package including an overmolded package body 88 having package topside surface 90 and a package bottomside surface 92 (FIG. 4), which are opposed in a package height direction (corresponding to the Z-axis of coordinate legend 94). Overmolded package body 88 is formed over and around variuos internal structures or components of leadless PA package 22 including a base flange 96 and a plurality of interposer mount pads 97-100 (generally corresponding to base flange 78 and interposer mount pads 76 shown in FIG. 1, respectively). Interposer pads 97-100 include a first set of interposer mount pads 97, 98 included in a first signal amplification path of the leadless PA package 22, and a second set of interposer mount pads 99, 100 included in a second signal amplification path. Overmolded package body 88 is at least partially drawn in phantom line or hidden from view in FIGS. 2-8 to more clearly illustrated the interior of leadless PA package 22; however, a lower dielectric body portion 102 is further shown in which base flange 96 and interposer mount pads 97-100 are embedded. As described more fully below in connection with FIGS. 9-12, lower dielectric body portion 102 may be integrally formed with the remainder of overmolded package body 88 as a single overmolded body. In alternative embodiments, lower dielectric body portion 102 can be formed via an initial overmolding process, with the remainder of overmolded package body 88 subsequently formed utilizing a second overmolding process. As a still further possibility, lower dielectric body portion 102 may not be overmolded, but rather composed of a ceramic, a PCB resin, or another dielectric material; in which case, lower dielectric body 102, base flange 96 and interposer mount pads 97-100 may be initially produced as a pre-fabricated structure; e.g., in this case, the pre-fabricated substrate may be purchased or otherwise obtained from a supplier as an individual unit or in an interconnected panel form.

Base flange 96 includes an upper surface 104 (referred to herein as "die mount surface 104") and an opposing lower flange surface 106. Multiple IC dies 108-111 are attach to different locations distributed across die mount surface 104 of base flange 96, which may extend substantially parallel to package topside surface 90 in at least some embodiments of leadless PA package 86. In the illustrated example in which leadless PA package 86 is imparted with a Doherty amplifier architecture and generally corresponds to leadless PA package 22 described above in connection with FIG. 1, four IC dies 108-111 are contained with PA package 86: (i) a first IC die 108 bearing a carrier-side input matching network (herein, "$MN_{CS}$ die 108"); (ii) a second IC die 109 bearing a peaking-side input matching network (herein, "$MN_{PS}$ die 109"); (iii) a third IC die 110 bearing a carrier amplifier IC (herein, "carrier RF power die 110"); and (iv) a fourth IC die 111 bearing a peaking amplifier IC (herein, "peaking RF power die 111"). $MN_{CS}$ die 108 and carrier RF power die 110 are positioned in a carrier signal amplification path, which extends through leadless PA package 86 and which is represented by a first arrow 112 shown in an upper portion of FIG. 3. Conversely, $MN_{PS}$ die 109 and peaking RF power die 111 are positioned in a carrier signal amplification path, which likewise extends through PA package 86 and which is represented by a second arrow 112 shown in a lower portion of FIG. 3.

A number of interposer structures or pieces 116-120, which collectively form a TTI arrangement 129 (identified in FIGS. 9 and 10), are further embedded in overmolded package body 88. As discussed below, outer terminal surfaces of the upper metallic layers or "upper interposer pads" included in interposer pieces 116-120 may be exposed along package topside surface 90 to define a topside I/O interface 121, 122, 123, 124, 125. In the illustrated example, specifically, an upper interposer pad of interposer piece 116 is exposed through package topside surface 90 to define a topside carrier input terminal 121; an upper interposer pad of interposer piece 117 is exposed through topside surface 90 to define a topside carrier output terminal 122; upper interposer pad of interposer piece 118 is exposed through topside surface 90 to define a topside peaking input terminal 123; an upper interposer pad of interposer piece 119 is exposed through topside surface 90 to define a topside peaking output terminal 124; and an upper interposer pad of interposer piece 120 is exposed through topside surface 90 to define a topside ground terminal 125. The exposed surfaces of the upper metallic pads of interposer pieces 116-120 defining topside terminals 121, 122, 123, 124, 125 may be plated or otherwise coated with at least one layer of an electrically-conductive material in embodiments. In other embodiments, the outer terminal surfaces of the upper metallic layers or upper interposer pads of interposer pieces 116-120 defining topside terminals 121, 122, 123, 124, 125 may be left bare or unplated. In either instance, the upper interposer pads of interposer pieces 116-120 (and, more generally, TTI arrangement 129) defining topside terminals 121, 122, 123, 124, 125 are considered exposed when accessible from package topside surface 90 for electrical connection with a corresponding electrical interface provided on a motherboard or other assembly-level substrate, as discussed more fully below in connection with FIG. 15.

As indicated above, interposer pieces 116-119 are each attached to and project upwardly from interposer mount pads 97-100 in a package height direction. Interposer pieces 116-119 may each be elongated in a package height direction and imparted with a sufficient height to extend from interposer mount pads 97-100 to package topside surface 90. In embodiments, the respective heights of interposer pieces 116-119 (identified by a first arrow 140 in FIGS. 5 and 6) may exceed and, perhaps, may be at least twice the height or thickness of base flange 96, as measured in the package height direction and as indicated by a second arrow 142 in FIGS. 5 and 6). Interposer pieces 116-119 defining signal-carrying topside terminals 121-124 are provided as relatively small, block-like pieces in the illustrated example, each having a generally square planform (top down) geometry. Comparatively, interposer piece 120 is attached to and projects upwardly from metallic base flange 96. Interposer piece 120 is imparted with an elongated form factor and a rectangular planform geometry to define a central isolation wall 127, which generally corresponds to central isolation wall 84 of PA package 22 shown in FIG. 1. Central isolation wall 127 of interposer piece 120 is elongated along its length and may extend a majority, if not the substantial entirety of the length of leadless PA package 86, as measured in the package length direction (corresponding to the X-axis of coordinate legend 94). Accordingly, central isolation wall 127 may extend from a first location adjacent a first sidewall of overmolded package body 88; between interposer pieces 116, 117; across a widened portion of base flange 96; between interposer pieces 118, 119; and to a second opposing sidewall of overmolded package body 88. Stated differently, central isolation wall 127 of interposer piece 120 includes a first end portion positioned between interposer pieces 116, 117; an intermediate portion positioned between $MN_{CS}$ die 108 and $MN_{CS}$ die 109, as well as between carrier RF power die 110 and peaking RF power die 111; and a second end portion positioned between interposer pieces 118, 119.

The lower interposer pad (or pads) of interposer piece 120 is bonded to die mount surface 104 of base flange 96; and, in embodiments, interposer piece 120 may be electrically coupled to base flange 96 utilizing an electrically-conductive bonding material, such as a solder material or a sintered bonding material. As shown most clearly in FIG. 4, metallic base flange 96 may be produced to include a main body from which two extensions or "flange tie bars" 130 extend in opposing directions. In such embodiments, flange tie bars 130 are located beneath interposer piece 120 (as viewed looking downwardly onto die mount surface 104 of base flange 96), extend substantially parallel to interposer piece 120, and may extend fully to (and thus breach) the opposing package sidewalls adjacent interposer pieces 116-119. When present, flange tie bars 130 provide at least two benefits. First, flange tie bars 130 provide increased surface area for (e.g., metallurgical) bonding with interposer piece 120 along the entire or substantially entire length of isolation wall 127 to provide a high strength, low electrical resistance joint at this interface. Second, flange die bars 130 facilitate the provision of base flange 96 as a leadframe, which further includes interposer mount pads 97-100. An example of such a leadframe is discussed below in connection with FIG. 11.

Various sets of wirebonds 132-138 are utilized to electrically conductive interposer mount pads 97-100 and IC dies 108-111. For example, and referring initially to the carrier signal amplification side of leadless PA package 86, a first set of wirebonds 132 electrically couples interposer mount pad 97 to an input pad of $MN_{CS}$ die 108; a second set of wirebonds 133 electrically couples input and output pads of $MN_{CS}$ die 108 to an input pad of carrier RF power die 110; and a third set of wirebonds 134 electrically couples the output pad of carrier RF power die 110 to interposer mount pad 98. Similarly, referring to the peaking signal amplification side of leadless PA package 86, a fourth set of wirebonds 135 electrically couples interposer mount pad 99 to an input pad of $MN_{PS}$ die 109; a fourth set of wirebonds 136 electrically couples input and output pads of $MN_{PS}$ die 109 to an input pad of peaking RF power die 111; and a sixth set of wirebonds 137 electrically couples the output pad of peaking RF power die 111 to interposer mount pad 100. In this manner, an electrically-conductive carrier signal amplification path (arrow 112, FIG. 3) is formed extending from topside terminal 121, through interposer piece 116, through interposer mount pad 97, and ultimately to carrier RF power die 110; and, from carrier RF power die 110, through interposer mount pad 98, through interposer piece 117, and to topside terminal 122. In a similar regard, an electrically-conductive peaking signal amplification path (arrow 114, FIG. 3) is formed extending from topside terminal 123, through interposer piece 118, through interposer mount pad 99, and ultimately to peaking RF power die 111; and, from peaking RF power die 111, through interposer mount pad 100, through interposer piece 119, and to topside terminal 124. Given the positioning and dimensioning of interposer piece 120 in the package length (X-axis) and package height (Z-axis) directions, interposer piece 120 provides in-package EM shielding between the across the substantial entirety of signal amplification paths to optimize RF performance. Relative to wirebonds 132-138, interposer piece 120 is imparted with sufficient heat to exceed the peak wire bond height taken along the entirety of the carrier and peaking signal amplification paths. Isolation is thus provided between the carrier and peaking sections of Doherty PA package 86, while enabling TT interposer grounding of RF power dies 110, 111 through interposer piece 120.

Figure 4:
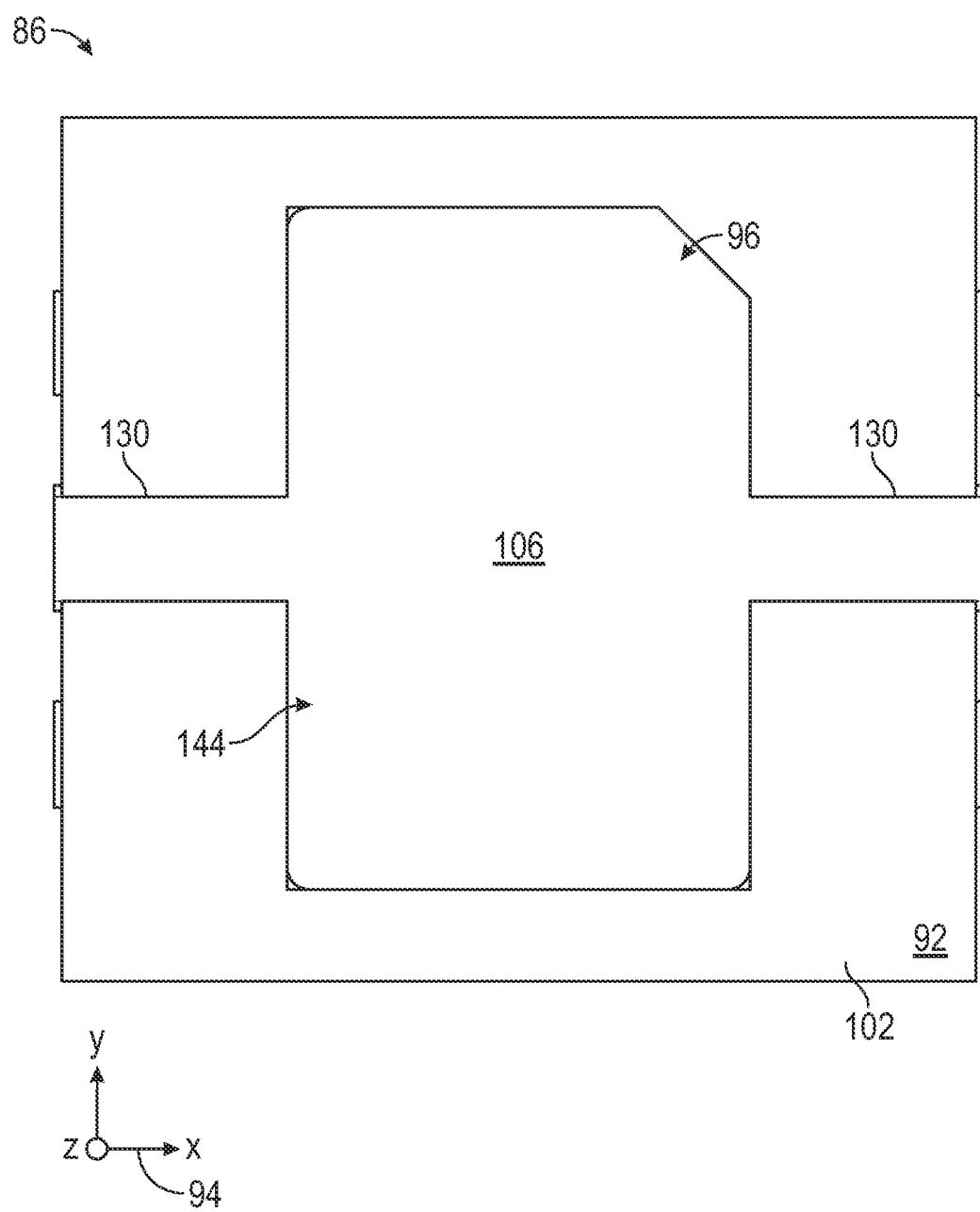
Figure 7:
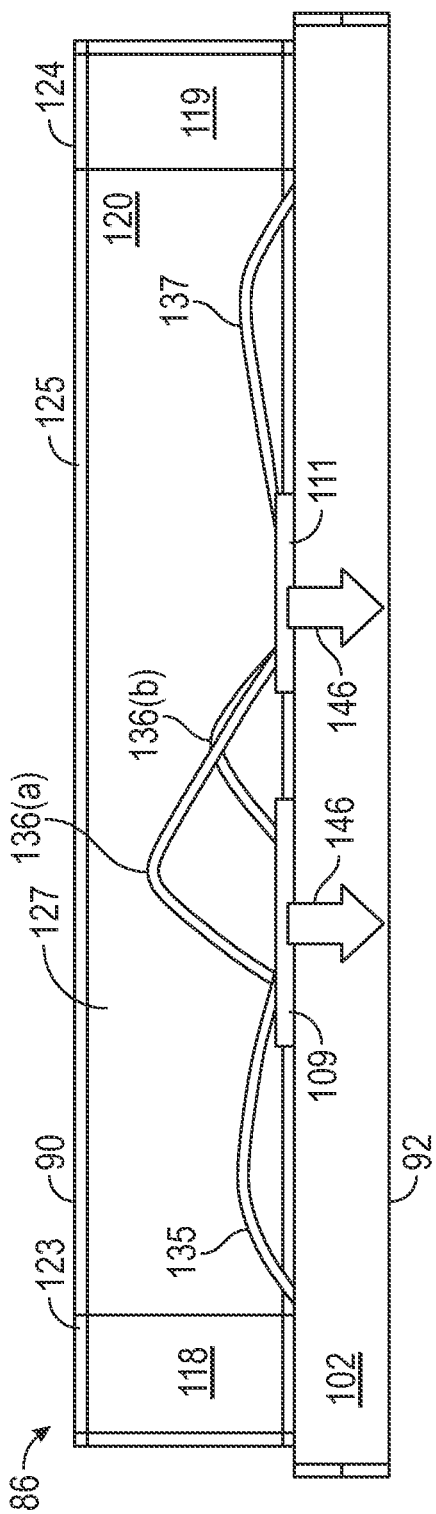
FIGS. 7 and 8 are opposing side views of the example leadless PA package shown in FIGS. 2-6 (rotated by 90 degrees about the package centerline relative to the side views of FIGS. 5 and 6), with the overmolded package body hidden from view.
Figure 8:
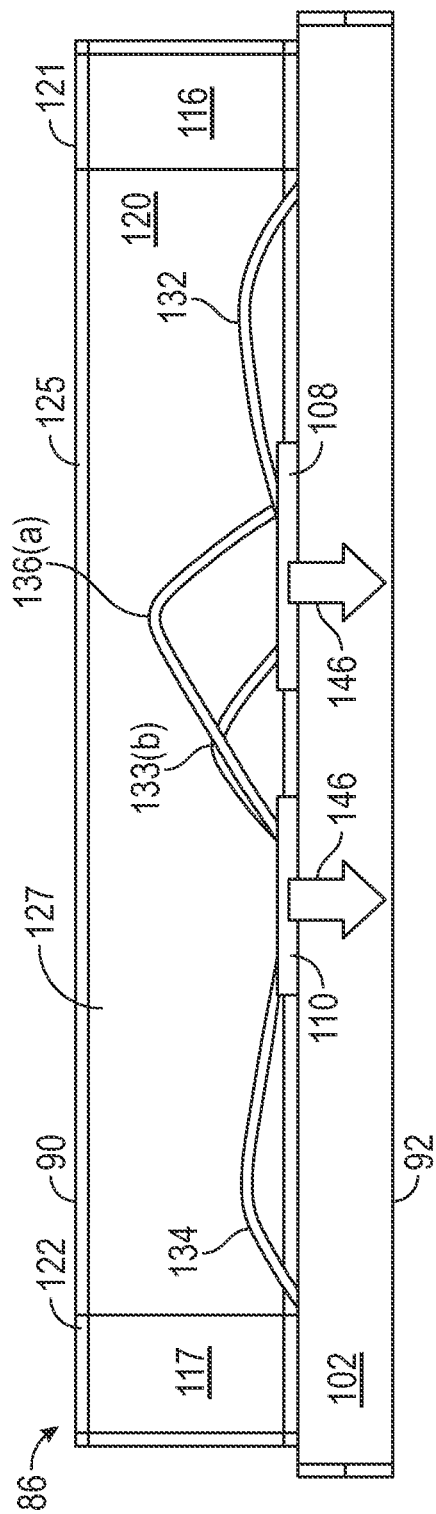

Embodiments of leadless PA package 22 may be further produced to include a bottomside thermal interface 144 (FIG. 4). Bottomside thermal interface 144 is formed by exposing lower flange surface 106 through package bottomside surface 92; e.g., in embodiments, lower flange surface 106 may be substantially coplanar with package bottomside surface 92 or, perhaps, may extend beyond package bottomside surface 92 by some amount Comparatively, and as indicated by arrows 153 in FIGS. 5 and 6, interposer mount pads 97-100 are imparted with a reduced thickness (e.g., a half-etch feature) to ensure that interposer mount pads 97-100 do not extend fully to package bottomside surface 92 to prevent electrical bridging when and if an electrically-conducive assembly-level heatsink is placed in contact with package bottomside surface 92 and lower flange surface 106, as described below. As further indicated in FIGS. 7 and 8 by heat extraction arrows 146, a direct, dimensionally-robust heat extraction path is thus created extending from IC dies 109-111, through the thermally-conductive bond layers utilized to attach IC dies 109-111 to die mount surface 104 of base flange 96, and to low flange surface 106. An efficient, direct (non-tortuous), volumetrically robust thermal conduction path for transferring excess heat from IC dies 109-111, and particularly from RF power dies 110, 111, to an assembly-level heatsink external to leadless PA package 86, when such an assembly-level heatsink present within the larger electronic assembly in which PA package 18 is ultimately installed.

Figure 9:
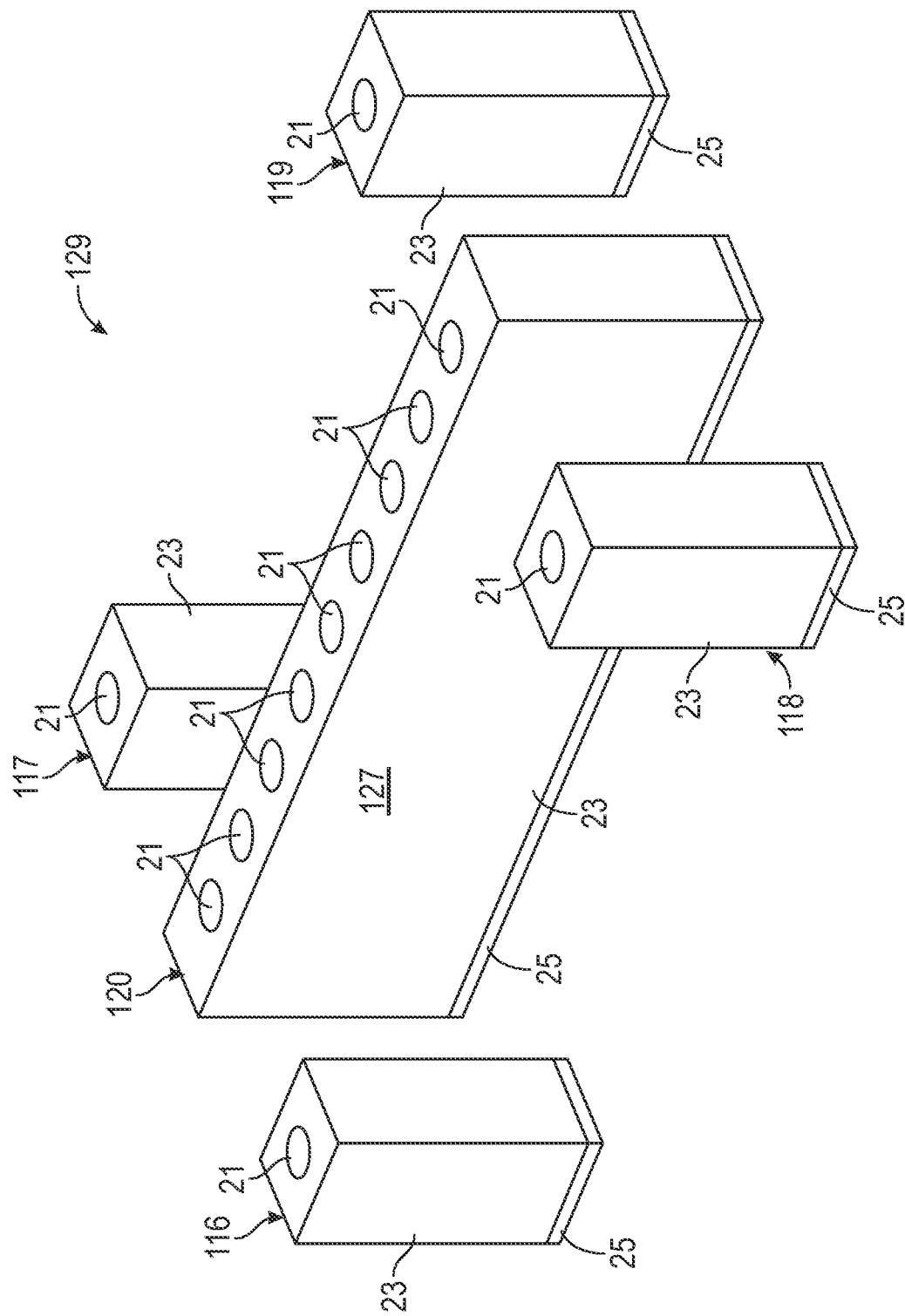
FIG. 9 is an isometric view illustrating the TTI arrangement, as shown in isolation with the upper interposer pads hidden from view to more clearly illustrate vias formed through the interposer bodies.
Figure 10:
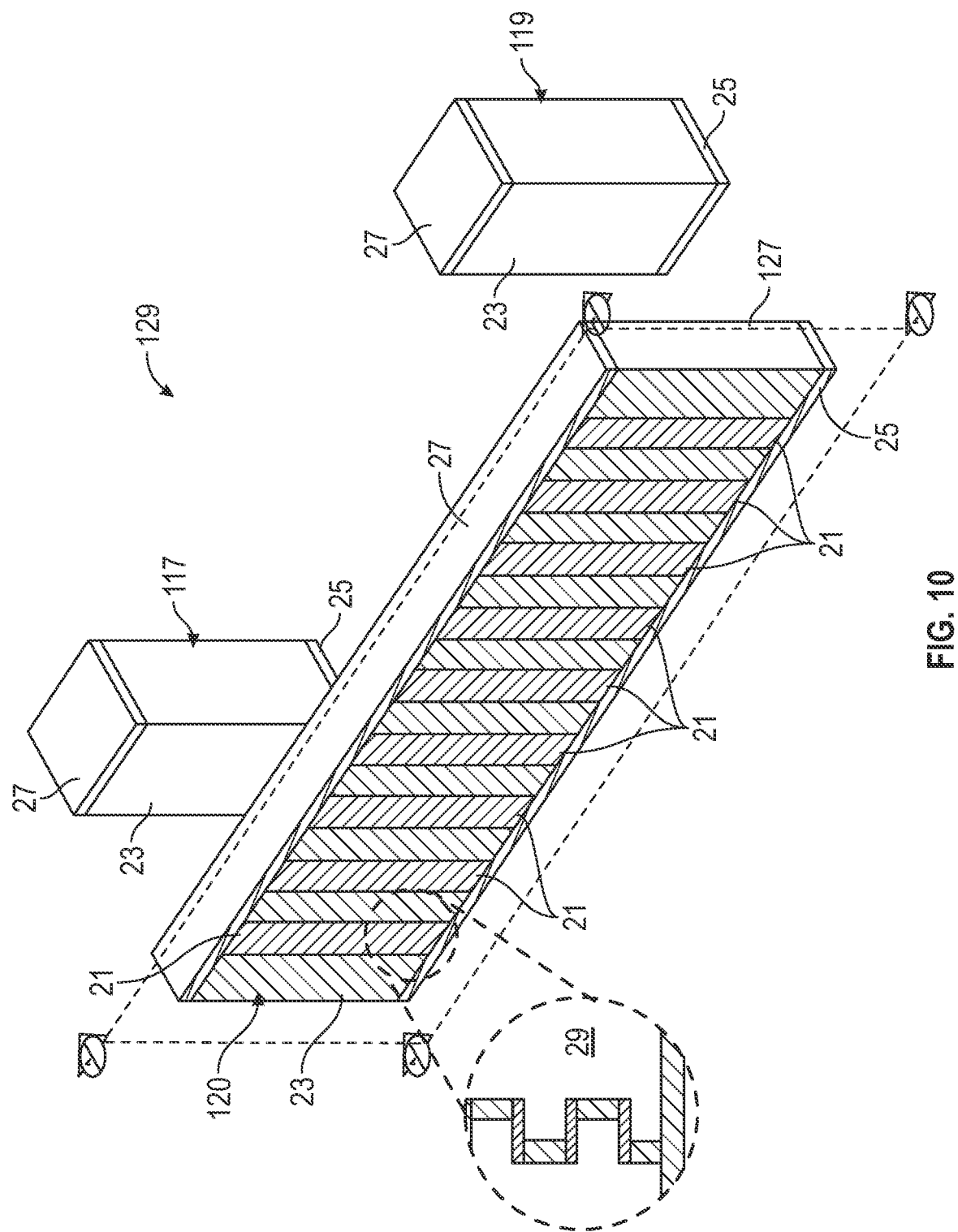
FIG. 10 is a cross-sectional view of the TTI arrangement, as shown in isolation and taken along a section extending through a central isolation wall included in the TTI arrangement.

Additional Description of the Example Topside Termination Interposer Arrangements FIGS. 9 and 10 depict interposer pieces 116-120, which collectively form TTI arrangement 129 contained in PA package 86, in isolation. Interposer pieces 116-120 are each produced to include a number of electrically-conductive interposer vias 21, are embedded within dielectric bodies 23 of interposer pieces 116-120. Interposer vias 21 each extend from a lower interposer pad 25 to an upper interposer pad 27 (FIG. 10) included in TTI arrangement 129 to provide electrical connections between corresponding pairs or groups of interposer pads 25, 27. Generally, interposer pieces 116-120 may be produced utilizing an electrically-routed substrates (e.g., single layer or multi-layer PCBs, ceramic substrates, or other dielectric substrates) containing plated vias, backfilled vias, coining, or other electrically-conductive features to vertically interconnect corresponding pairs of interposer pads 25, 27. In embodiments in which interposer pieces 116-120 are fabricated as discrete pieces of PCB, the dielectric layers of the PCB (or other structure) may be composed from a suitable dielectric material, such as FR-4, while copper (Cu) or other features are formed on and through the dielectric layers to produce vias 21. In this case, interposer vias 21 may be fabricated have a more complex structure typical of vias formed through multilayer PCBs, such as that indicated in a detail bubble 29 shown on the left of FIG. 10. In other implementations, interposer pieces 116-120 may be composed of a dielectric structure (e.g., a coreless substrate) having metallic (e.g., Cu) coining or another conductive, which is separately fabricated and subsequently embedded in the dielectric interposer body to form one or more of the interposer vias 21. As a still further possibility, interposer pieces 116-120 can be provided as dielectric bodies (e.g., ceramic pieces) processed to create vertical openings therewith, which are then plated or backfilled with electrically-conductive material to produce vias 21. For example, in one approach, one or more ceramic pieces may be subject to a material removal process, such as laser drilling, to create a number of vertically-extending tunnels. The vertically-extending tunnels may then be plated with a Cu or another metallic material utilizing electroplating or electroless plating technique. Various other interposer constructions are also possible, providing that interposer pieces 116-120 are capable of providing the desired electrical interconnections between topside terminals 121-125 (identified in FIGS. 2, 3, and 5-8) and the corresponding internal electrical contacts (e.g., base flange 96 and interposer mount pads 97-100) contained in PA package 86.

In the illustrated embodiment, a single row of interposer vias 21 is formed in the dielectric body 23 of central isolation wall 127. Interposer vias 21 extend between the upper metallic layer of interposer piece 120 and the lower metallic layer of interposer piece 10. As shown, the upper and lower metallic layers may be left unpatterned to define a single upper interposer pad 27 and a single lower interposer pad 25, respectively; or, in other instances, one or both of the upper and lower metallic layers may be patterned to define multiple interposer pads. The upper or outer terminal surfaces of upper interposer pad 27 may be exposed through the package frontside, as previously described, and serve as a current return contact or ground terminal 125 included in the topside I/O of PA package 22. In this case, ground terminal 125 provides a ground connection through upper interposer pad 27, through the row of interposer vias 21 extending vertically through central isolation wall 127, through lower interposer pad 25, and to base flange 96. In further embodiments, central isolation wall 127 may contain a different number of vias disposed in another spatial arrangement, such as a single bar via (or a smaller number of bar vias) as described below in connection with FIG. 26 or multiple rows of vias as described below in connection with FIGS. 23-25. Depending upon implementation, the vias contained in central isolation wall 127 (and the other vias contained in interposer pieces 116-119) may have square, circular, or other geometries, as taken along a section plane extending orthogonal to the length direction of a given via 21. While all of the vias 21 included in central isolation wall 127 will often be electrically coupled to ground in embodiments, this may not always be the case. For example, in certain embodiments, one or more of the interposer vias may be left electrically floating if electrically connected to dummy pads included in PA package 86. Similarly, in further implementations, additional grounded vias or floating vias may be formed in interposer pieces 116-119 to provide additional shielding of the (e.g., RF) input and output signals conducted through these interposer pieces.

By virtue of the incorporation of TTI arrangement 129 into PA package 22 and the other structural characteristics of PA package 22 described above, the electrical and thermal paths of leadless PA package 22 are effectively separated. In particular, the electrical and thermal paths of leadless PA package 22 generally progress through PA package 22 in opposing directions to enable mounting of PA package 22 between an assembly-level substrate for electrical connection and an assembly-level heatsink for thermal dissipation. This, in effect, provides a highly effective thermal management solution to further optimize RF power die performance, particularly when RF power dies 110, 111 (and, most relevantly, carrier RF power die 110) is fabricated utilizing a power dense die technology, such as a GaN layered die structure. Additional description in this regard is provided below in connection with FIG. 15. First, however, examples of manufacturing processes suitable for fabricating leadless PA package 22 in combination with a plurality of similar PA packages is discussed in connection with FIGS. 11-14.

Figure 11:
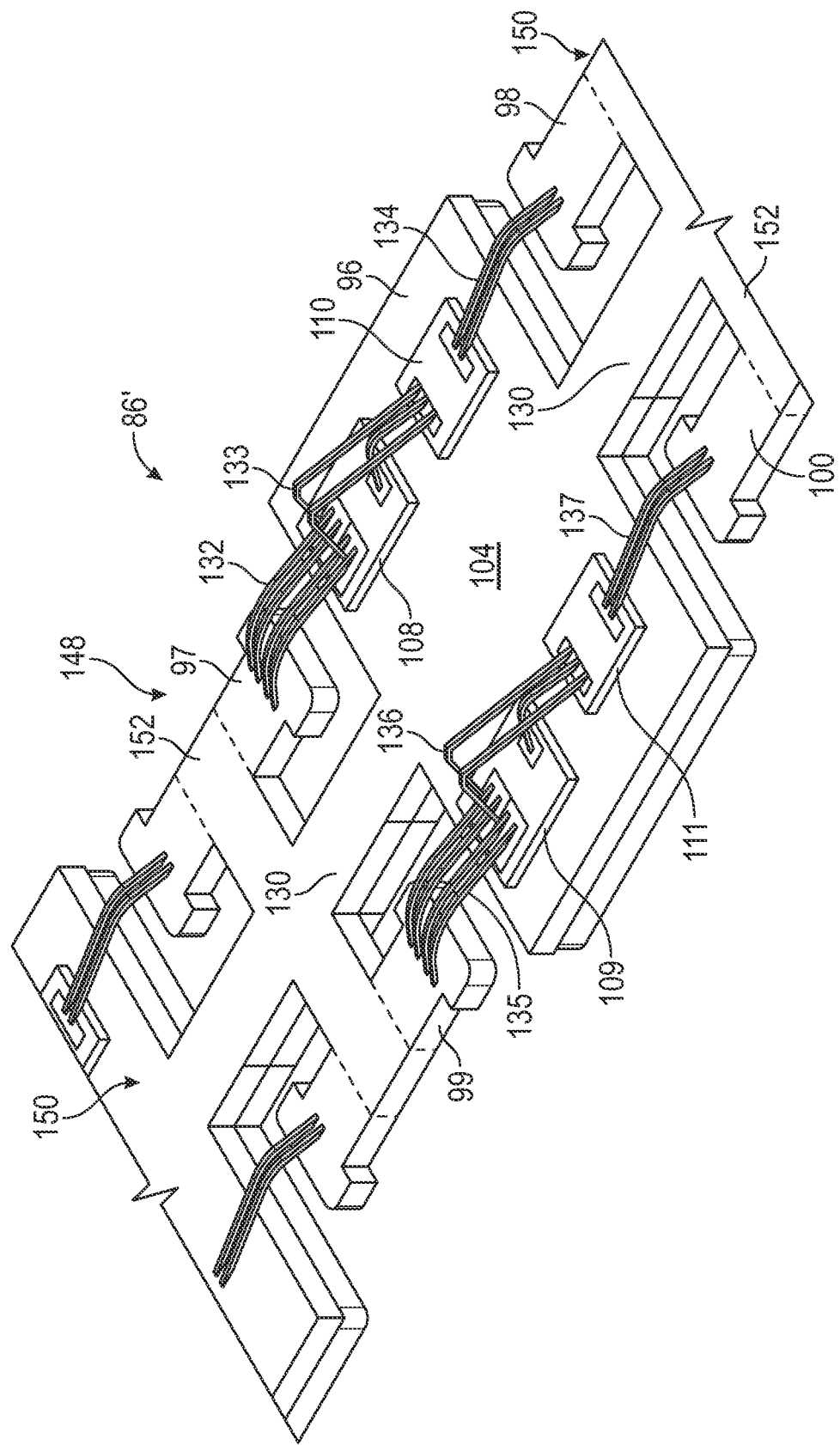
FIGS. 11-14 illustrate the example leadless PA package of FIGS. 2-8, as shown at various stages of manufacture and produced in accordance with an example fabrication process.

Example Methods for Fabricating a Leadless Pa Package Having Topside Termination Interposer Arrangements FIGS. 11-14 illustrate example leadless PA package 86 shown in FIGS. 2-8 at various stages of manufacture. Referring initially to FIG. 11, leadless PA package 86 is shown in an intermediate stage of manufacture and is thus identified by reference numeral "86'," the prime symbol (') appended to reference numerals when denoting structural elements in an incomplete or partially-fabricated state. Additionally, leadless PA package 86 is fabricated utilizing a leadframe-based manufacturing approach in FIG. 11, with a limited region of a leadframe array 148 shown. Leadframe array 148 is processed to produce a plurality of addition leadless PA packages 150 in parallel with leadless PA package 86. The process steps described below in connection with leadless PA package 86' are performed globally across leadframe array 148; and, thus, should be understood as equally applicable to addition leadless PA packages 150 and the other non-illustrated leadless PA packages produced in parallel with leadless PA package 86. For this reason, FIGS. 12-14 focus on the portion of leadframe array 148 (namely, leadframe 96-100, 152) processed to specifically produced leadless PA package 86, while not illustrating the processing of leadframe 96-100, 152 (and the larger overmold panel, when produced) on a larger scale.

In the illustrated example embodiment, IC dies 108-111 are attached to base flange 96 included in leadframe 96-100, 152 and wirebonds 132-137 are formed prior to attachment of interposer pieces 116-120 (collectively forming TTI arrangement 129). Thus, IC dies 108-111 are placed in their desired positions on die mount surface 104 of base flange 96 and bonded thereto utilizing a suitable bonding material. In embodiments in which it is desired to electrically coupled one or more of IC dies 108-111 to base flange 96 (e.g., as in the case of carrier RF power die 110 and peaking RF power die 111), an electrically-conductive bonding material is utilized. In one embodiment, one or more sinter bond layers may be utilized and formed by depositing a sinter precursor material, which is subsequently cured to form sintered bond layers attaching one or more of IC dies 108-111 to base flange 96. Such sinter bond layers are also advantageously utilized to attach interposer pieces 116-120 to base flange 96 in embodiments. In other embodiments, a different electrically-conductive material may be utilized to provide mechanical and electrical connection to base flange 96, where desired, including solders and electrically-conductive die attach materials, such as metal-filled (e.g., Ag-filled) epoxies. IC dies 108-111 may be initially provided on tape and reel, or utilizing another media, and placed in their desired positions utilizing a pick-and-place tool. The chosen bonding material may be dispensed onto the appropriate locations of base flange 96 prior to die placement; and, following die placement, thermal or ultraviolet curing may be performed. After attachment of IC dies 108-111, a wirebonding technique, such as ball bonding, is conducted to produce wirebonds 132-137.

Figure 12:
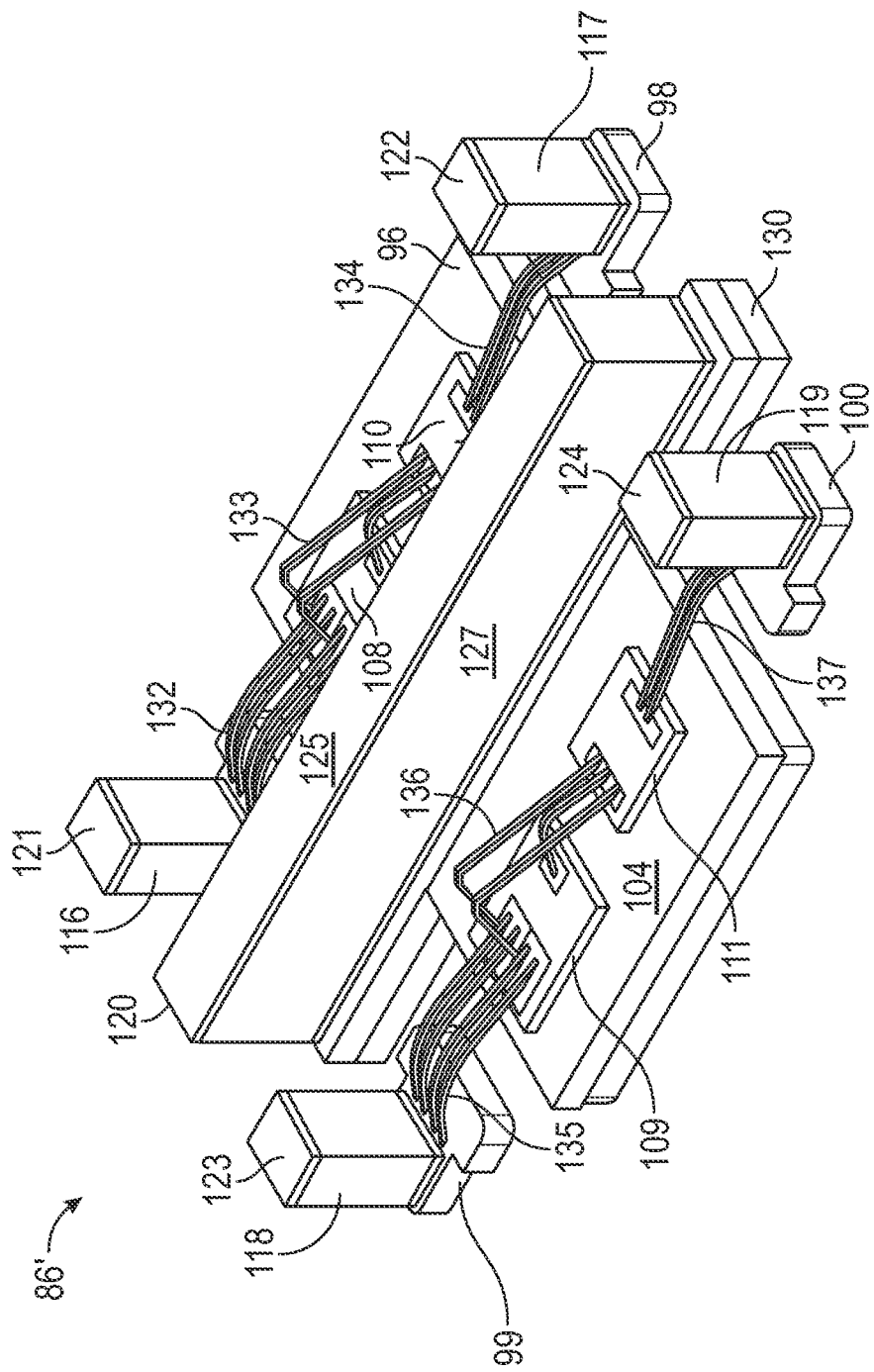
Figure 13:
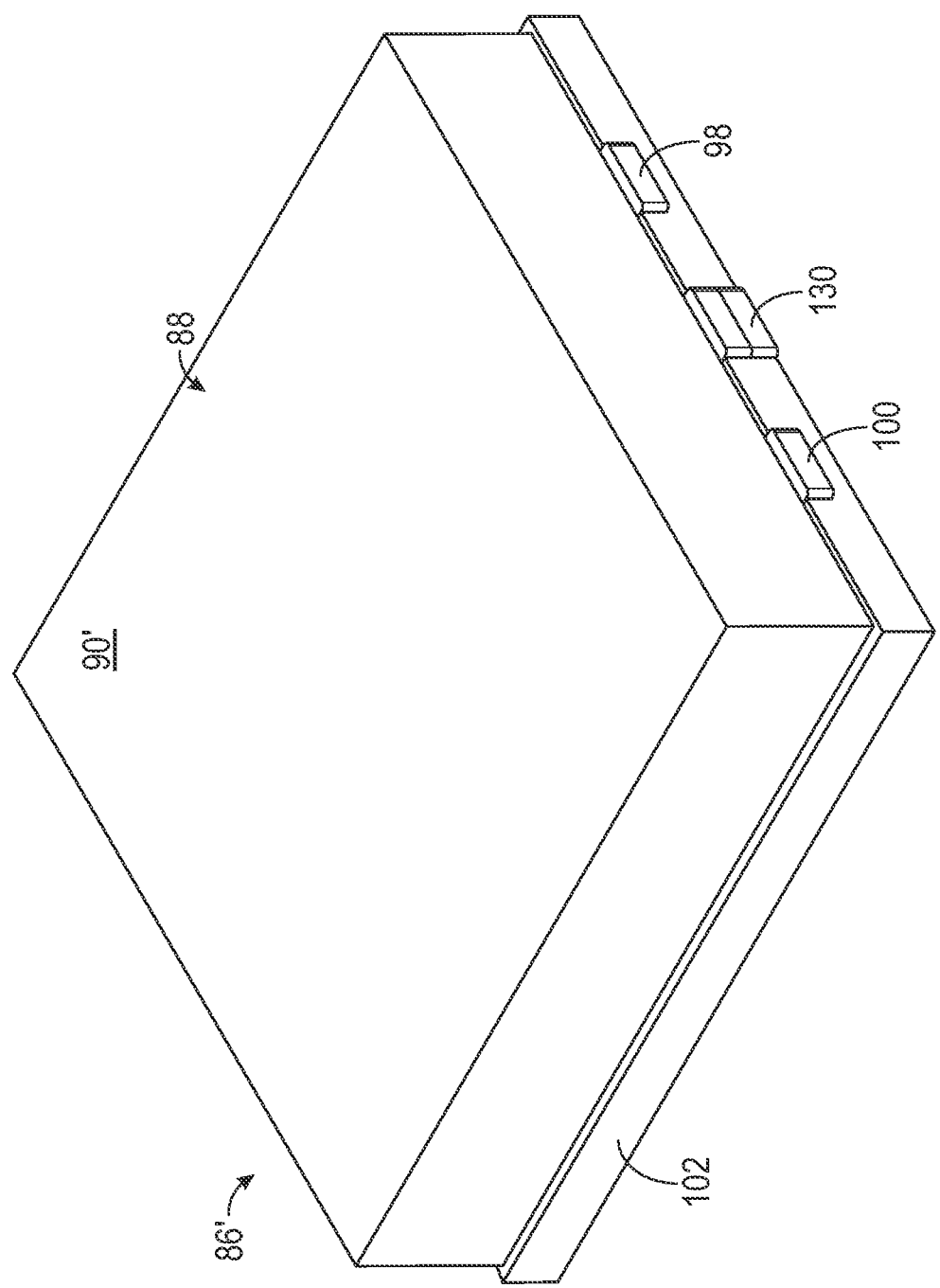
Figure 14:
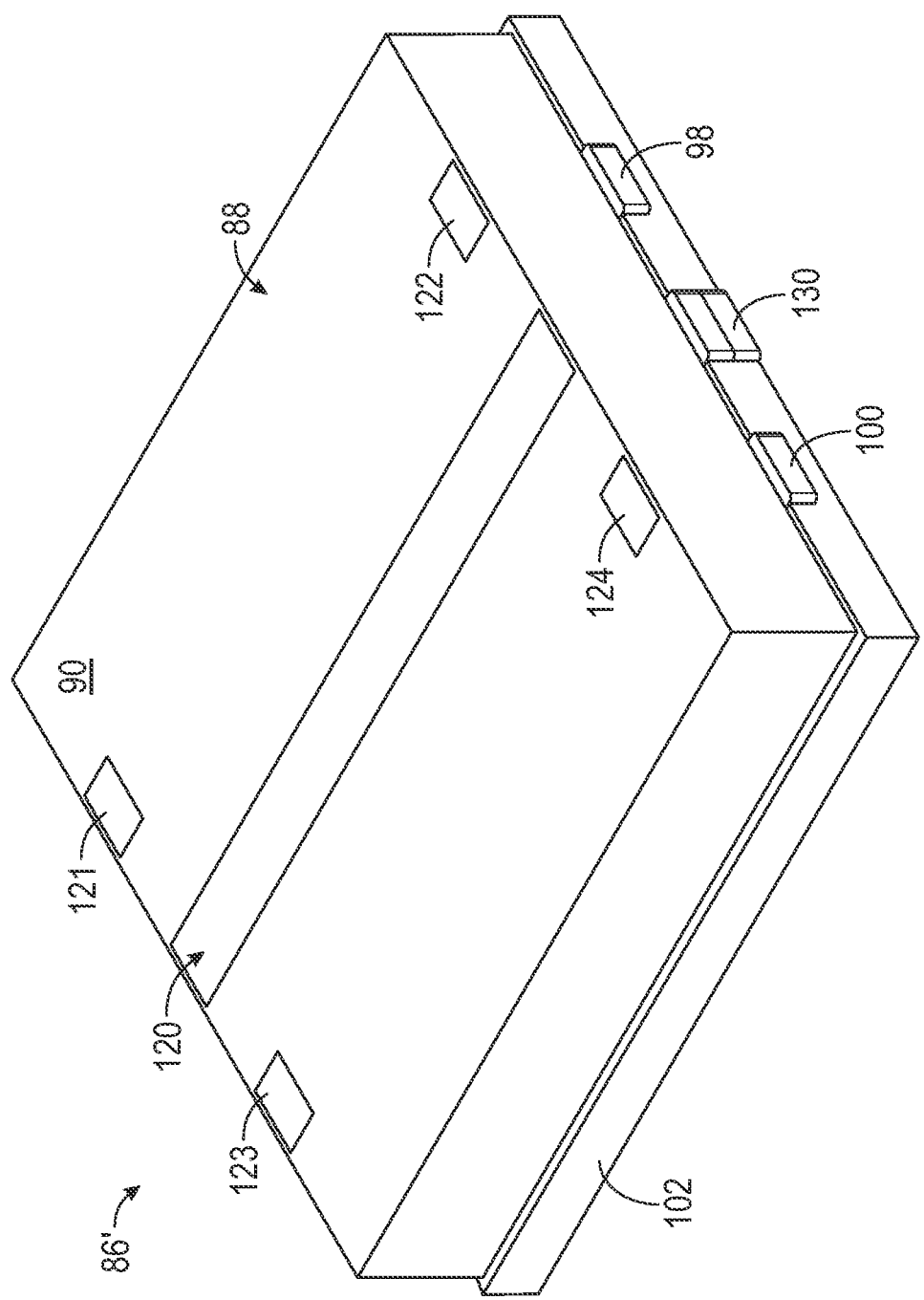

Referring next to FIG. 12, interposer pieces 116-120 (and, more generally, TTI arrangement 129) are positioned onto interposer mount pads 97-100 and base flange 96. An electrically-conductive bonding material is utilized to form the desired mechanical and electrical joints between interposer pieces 116-120 are positioned onto interposer mount pads 97-100 and base flange 96. Various electrically-conductive bonding materials can be utilized, including solder, metal-filled (e.g., Ag-filled) epoxies, and electrically-conductive die attach materials. In other embodiments, interposer pieces 116-120 may be joined to interposer mount pads 97-100 and base flange 96 utilizing sintered bond layers; that is, bond layers formed from sintered metallic particles and predominately composed of one or more metallic constituents, by weight. When formed from such sintered materials, the bond layers may be predominately composed of Cu, Ag, gold (Au), or a mixture thereof, by weight. Also, in such instances, the sintered bonds layers may or may not contain organic materials, such an epoxy added for strengthening purposes. In certain embodiments, a sinter precursor material is applied utilizing either a wet state or dry state (e.g., film) application technique. For example, in one approach, a sinter precursor material may be deposited onto selected regions of interposer mount pads 97-100 and base flange 96 by screen or stencil printing or utilizing fine needle dispense techniques. In other embodiments, a sinter precursor material may be applied (e.g., by spraying or dipping) to appropriate surfaces of interposer pieces 116-120 prior to seating onto interposer mount pads 97-100 and base flange 96. Curing may then be performed through low temperature heating (with or without the application of pressure) to transform the sinter precursor material into sinter bond layers forming metallurgical bonds at the various interfaces between the interposer pieces 116-120 of TTI arrangement 129, interposer mount pads 97-100, and base flange 96.

Following attachment of interposer pieces 116-120, the above-described components included in partially-fabricated leadless PA package 86' and, more generally, leadframe array 148 are overmolded. Overmolding may involve dispensing a suitable encapsulant material (e.g., a thermosetting polymer) in a heated, flowable state. The overmold panel (including overmolded package body 88 shown in FIG. 11) is formed to have an excessive thickness or overburden, which fully encapsulates interposer pieces 116-120. After this, overmolded package body 88 (and, more broadly, the overmold panel) is thinned by removing material from package topside surface 90. A back-grinding process may be utilized for this purpose, with the term backgrinding encompassing various grinding and polishing processes suitable for removing material from overmolded package body 88 (and the overmold panel, generally) in a controlled manner. The topside package surface 90 is background to expose the upper interposer pads of interposer pieces 116-120 (collectively forming the TTI arrangement), thereby yielding the topside I/O interface including topside I/O terminals 121-125 (shown in FIG. 12). If desired, the newly-exposed topside I/O terminals 121-125 may be electroplated to form a suitable plating finish on topside I/O terminals 121-125; and, perhaps, on other exposed metal regions of the partially-fabricated PA packages. Such plating layers can be composed of tin (Sn), nickel-palladium-gold (NiPdAu), or another metallic material in embodiments. Notably, such an electroplating process can be conducted by applying an electrical potential to leadframe array 148 itself, given that leadframe array 148 remains electrically coupled to interposer pieces 116-120 (collectively forming the TTI arrangement) at the present juncture in the fabrication process. Finally, the overmold panel and leadframe array 148 are singulated (e.g., by sawing) to yield a plurality of leadless PA packages including leadless PA package 86. Singulation removes sacrificial portions 152 from leadframe array 148 (identified in FIG. 11) to electrically isolate interposer pieces 116-120. In further embodiments, sacrificial portions 152 may be reduced in one or more dimensions, grooves may be formed in the bottomside of sacrificial portions 152, or similar volume reduction modifications can be made to sacrificial portions 152 minimize the metal volume through which a saw blade passes during singulation of leadframe 96-100, 152.

The foregoing has thus described an example method for fabricating leadless PA package 86 in parallel with a plurality of similar PA packages. Further embodiments of the manufacturing process may differ in various respects. For example, in an alternative manufacturing approach, a bonding material, such as a metal particle-containing (e.g., Ag-containing) paste may be initially printed or otherwise dispensed in a desired pattern across leadframe array 148. IC dies 109-111 and interposer pieces 116-120 may then be positioned across leadframe array 148 and onto the appropriate mount locations of interposer mount pads 97-100 and base flange 96. A global curing step may then be performed to concurrently bond IC dies 109-111 and interposer pieces 116-120 to interposer mount pads 97-100 and base flange 96. Additional processing steps, such as plasma cleaning, may be performed, followed by interconnection (e.g., wirebonding), overmolding, and singulation, as previously described. In other implementations, similar processing steps may be followed, while the interposer piece or pieces contained in TTI arrangement 129 assume a different form, several examples of which are discussed below in connection with FIGS. 16-27. In still further implementations, leadless PA package 86 may be produced as an air cavity package rather than an overmolded or encapsulated package. For example, in this latter case, embodiments of the leadless PA package may be fabricated as a lidded air cavity package, with openings provided in the lid or cover piece of the PA package to allow contact to upper terminal ends of the TTI arrangement including in the topside I/O interface. Such an approach may be practical when, for example, the PA packages are larger in size.

Figure 15:
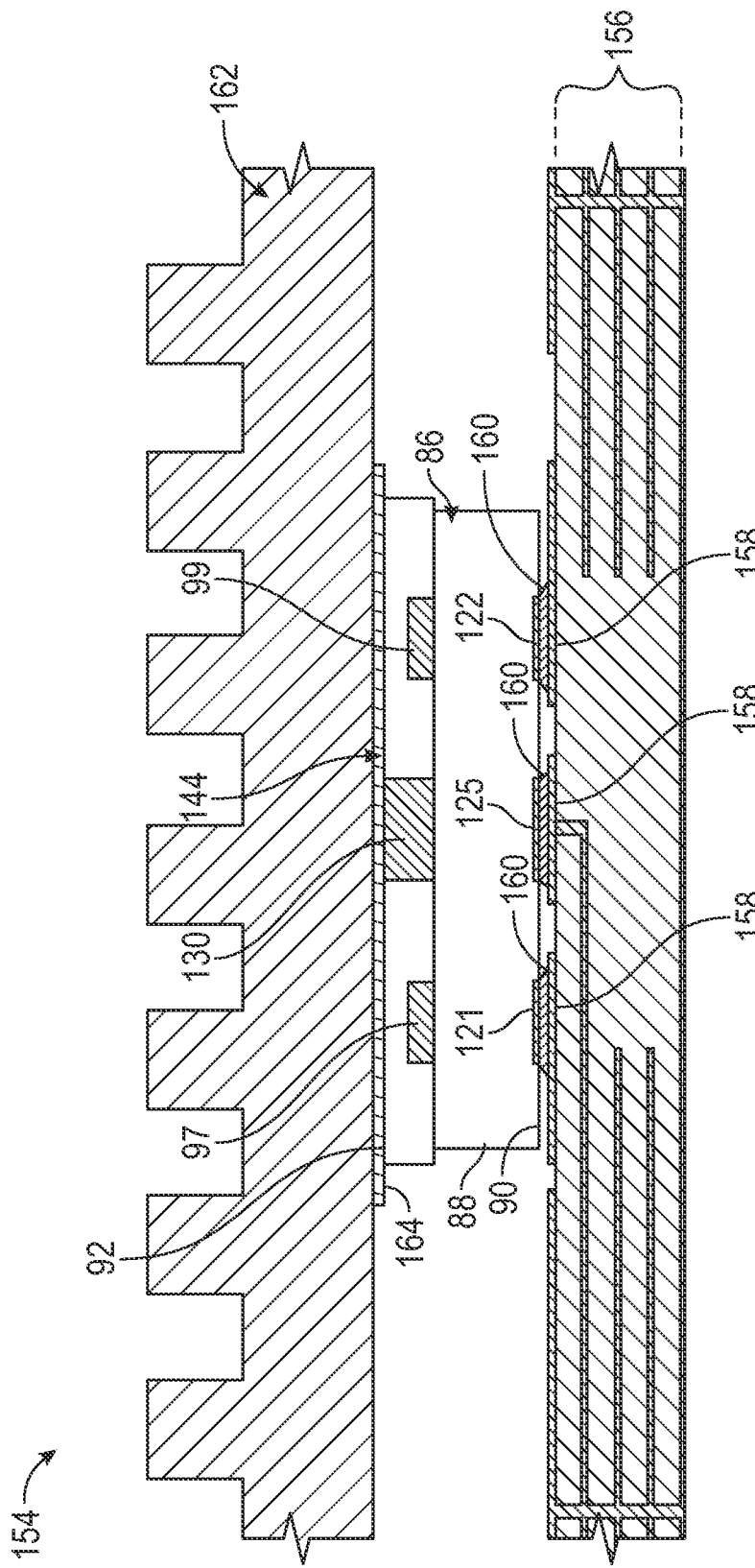
FIG. 15 illustrates one manner in which the example leadless PA package of FIGS. 2-8 may be installed within a larger electronic system or assembly in an inverted orientation, as illustrated in accordance with an example embodiment.

Example Installation of the Leadless Pa Package in an Electronic System or Assembly FIG. 15 illustrates one manner in which leadless PA package 86 shown in FIGS. 2-8 may be installed within a larger electronic system or assembly 154, as illustrated in accordance with an example embodiment. Electronic assembly 154 includes an assembly-level substrate 156, such as a motherboard, to which PA package 86 is mounted in an inverted orientation such that package topside surface 131 faces assembly-level substrate 156. The topside I/O interface of PA package 86 is electrically coupled to corresponding interconnect features (e.g., bond pads and traces) on the upper surface of assembly-level substrate 156 utilizing any suitable interconnection technique, such as solder connection (noting solder bodies 160) to an LGA 158. In other embodiments, a patterned solder layer, a pin grid array (PGA), or a ball grid array (BGA) may be utilized to mount PA package 86 to and electrically interconnect PA package 86 with assembly-level substrate 156. Further, only a limited portion of assembly-level substrate 156 is shown in FIG. 15 for clarity. Various other components may be distributed across the non-illustrated portions of assembly-level substrate 156 to form the desired circuit structure.

An assembly-level heatsink 162 may be mounted directly to bottomside surface 92 of PA package 86 and bonded to bottomside thermal interface 144 (FIG. 4) utilizing, for example, a thermally-conductive bond layer 164 in embodiments. Thermally-conductive bond layer 164 can be composed of any thermally-conductive bonding material, such as a sintered bond layer or another bonding material (whether electrically conductive or dielectric) having a relatively low thermal resistance. In other embodiments, assembly-level heatsink 162 may be thermally coupled to bottomside thermal interface 144 in a less direct manner. For example, in other instances, assembly-level heatsink 162 may be spatially separated from PA package 86 and a thermal conduit, such as a metallic body or an elongated heat pipe, may be thermally coupled between heatsink 162 and bottomside thermal interface 144. Regardless of its particular location relative to PA package 86, assembly-level heatsink 162 can be any thermally-conductive structure or device suitable for absorbing excess heat extracted from PA package 86 through bottomside thermal interface 144. For example, in embodiments, assembly-level heatsink 162 may be a metal chassis, a fin structure (e.g., a pin-fin array), or another thermally-conductive body external to PA package 86. Assembly-level heatsink 162 may be convectively cooled by releasing heat to the ambient environment; and, in certain embodiments, a fan may direct airflow against assembly-level heatsink 162 to promote convective heat transfer to the impinging airflow. It is also possible for assembly-level heatsink 162 to be actively cooled utilizing a liquid coolant in embodiments. Generally, then, assembly-level heatsink 162 can assume different forms and configurations depending upon the characteristics of electronic assembly 154. It is also possible for PA package 86 to be installed within a larger electronic system or assembly, while bottomside thermal interface 144 is left exposed (and thus not directly thermally coupled to a heatsink) if such an arrangement provides sufficient heat dissipation from PA package 86 in certain applications.

Additional Examples of Topside Termination Interposer Arrangements

The foregoing has thus described example leadless PA packages containing different TTI arrangements, such as TTI arrangement 129 formed by interposer pieces 116-120 in the case of PA package 86 shown in FIGS. 2-10, 12, and 14. In the above-described example embodiments, the example TTI arrangements are provided utilizing multiple discrete pieces, such as separate PCB pieces or dielectric (e.g., ceramic) blocks with embedded interposer vias, which are placed in their desired positions (e.g., utilizing a pick-and-place tool) and bonded to an underlying a base structure (e.g., interposer mount pads and a base flange) during a PA package fabrication process. In further implementations of the leadless PA package, the TTI arrangement contained within the PA package can be formed or provided utilizing various other combinations of interposer pieces, including a single, relatively expansive interposer piece in certain instances. Additionally, one or more interposer pieces may be combined with metallic blocks or similar structures in certain instances to produce the PA package. For example, and referring briefly again to leadless PA package 86 shown in FIGS. 2-14, interposer pieces 116-119 can potentially be replaced with metallic columns (e.g., singulated portions of rod composed of a particular metal or alloy, such as Cu) combined with central interposer piece 120 in further implementations of PA package 86. Conversely, interposer piece 120 may be replaced with laminate or monolithic structure, such as a metallic (e.g., Cu) fin or wall combined with interposer pieces 116-119 in some embodiments. Generally, the ability to form the TTI arrangement from one or more interposer pieces, which can possess a wide range of form-factors, constructions, and placements tailored to accommodate a specific package architecture provides a high level of design flexibility. To further illustrate this point, additional description of other TTI arrangements suitable for integration into the above-described leadless PA package 86 in place of TTI arrangement 129, or otherwise suitable for integration into similar PA packages, will now be described in connection with FIGS. 16-31.

Figure 16:
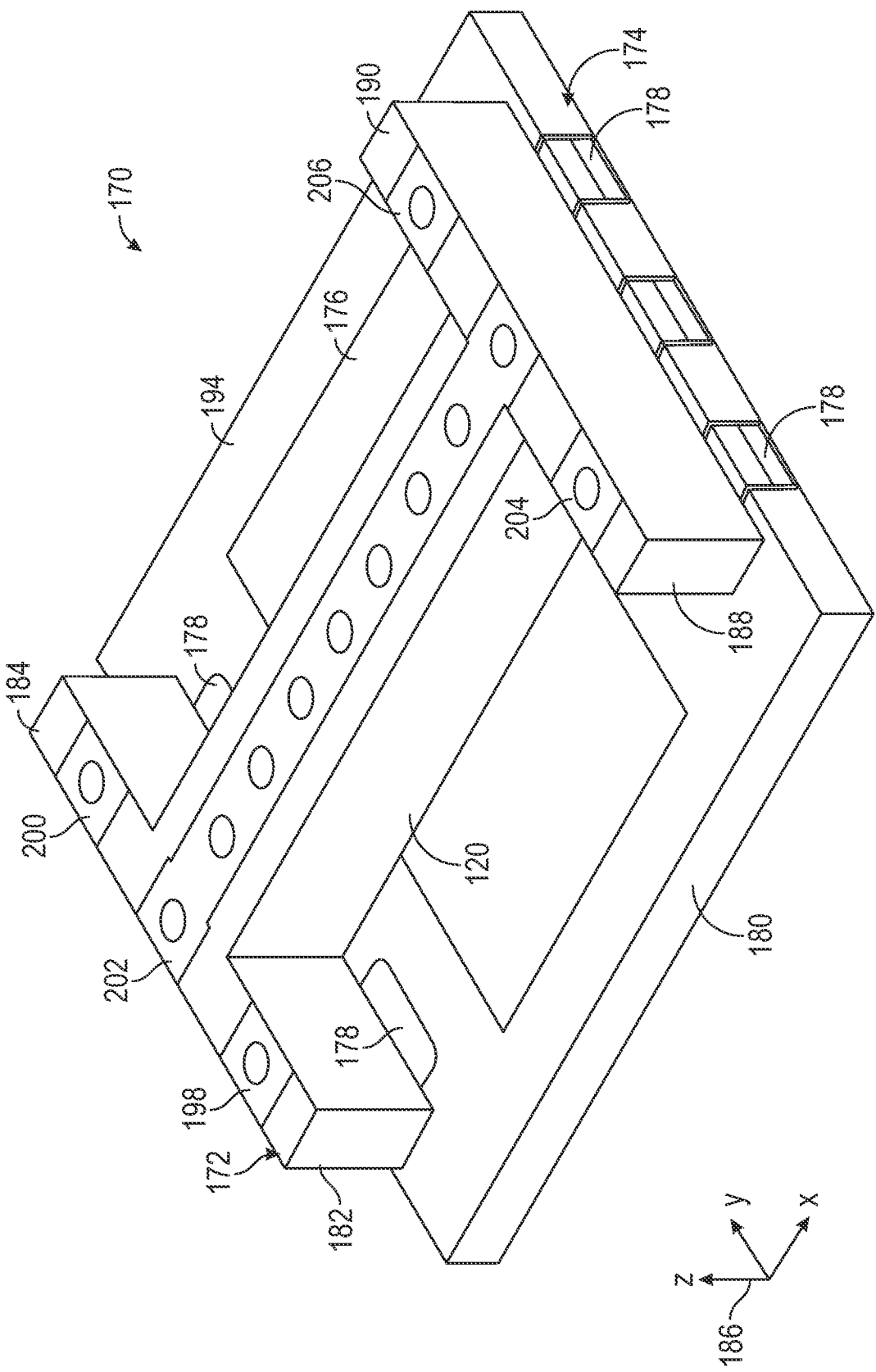
FIG. 16 is an isometric view of a TTI arrangement provided utilizing a single interposer structure or piece having an I-shaped planform (top-down) geometry, which is illustrated in accordance with a further example embodiment of the present disclosure.
Figure 17:
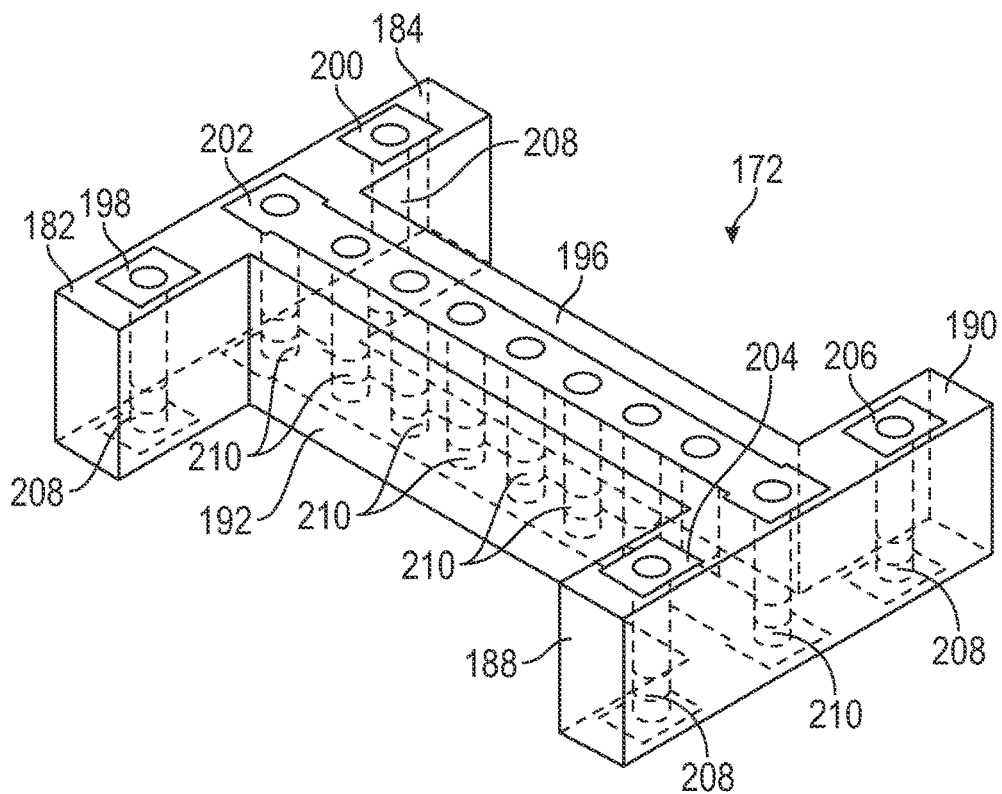
FIG. 17 is an isometric view of the TTI arrangement shown in FIG. 16 further depicting vias (shown in phantom) formed in the dielectric interposer body to electrically connect corresponding pairs or groups of upper and lower interposer pads.
Figure 18:
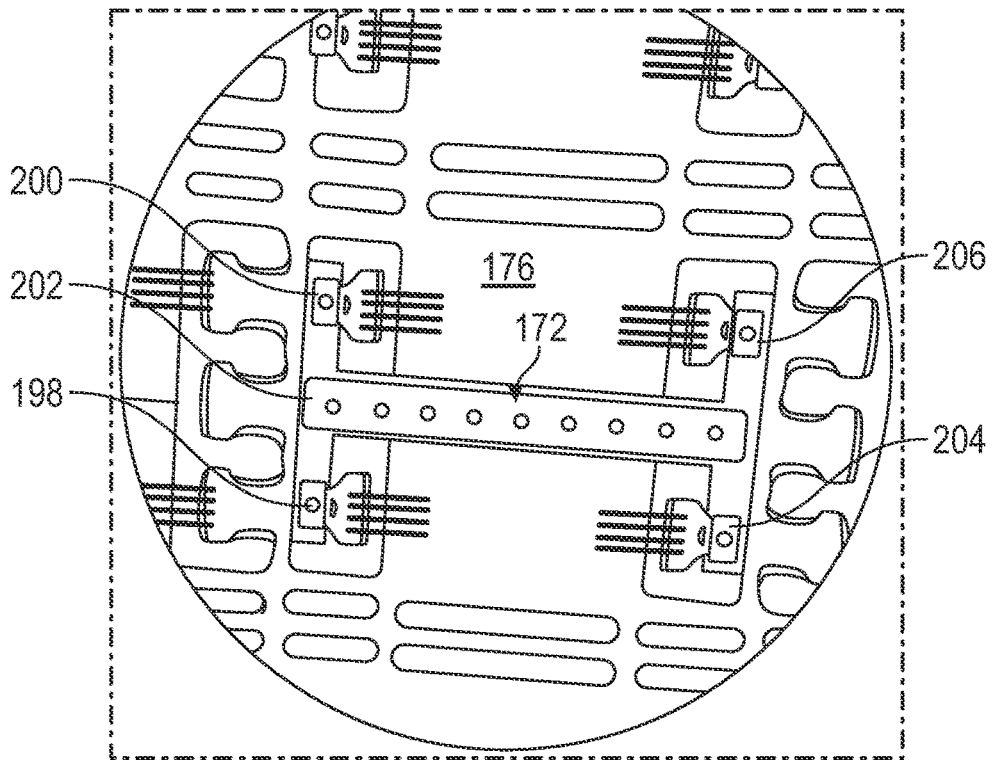
FIG. 18 is a magnified isometric view of the TTI arrangement shown in FIGS. 16 and 17, as reduced to practice and bonded to a leadframe array during an intermediate stage of a leadless PA package manufacturing process.

Referring now to FIGS. 16 and 17, there is shown a partially-fabricated PA package 170 containing a TTI arrangement in the form of a single interposer structure or piece 172. Interposer piece 172 is fabricated to include a dielectric body 196; a patterned upper metal layer defining multiple upper interposer pads 198, 200, 202, 204, 206; a patterned lower metal layer defining multiple lower interposer pads (not labeled, but visible in FIG. 17); and any number of interposer vias 208, 210 (shown in phantom FIG. 17). Given its relatively expansive size compared to the overall planform dimensions of PA package 170, interposer piece 172 encompasses the spatial volume occupied by interposer pieces 116-120 of PA package 86 (FIGS. 2-14) and may thus effectively replace these interposer pieces in embodiments. Interposer piece 172 is bonded to an underlying base substrate or structure 174, which includes a dielectric body in which a flange 176 and a number of interposer mount pads 178 are embedded. Interposer piece 172 includes a first wing section 182, 184; a second wing section 188, 190; and a central wall section 192 connected between wing section 182 and wing section 188, 190. Wing section 182, 184 of interposer piece 172 is elongated along an axis parallel to the Y-axis of coordinate legend 186 appearing in the bottom left of FIG. 16. Comparatively, wing section 188, 190 is elongated along an axis parallel to the Y-axis of coordinate legend 186, while a central wall section 192 elongated along an axis parallel to the X-axis of coordinate legend 186. Central wall section 192 thus extends substantially perpendicular to the wing section 182, 184 and wing section 188, 190; while further extending between and connecting wing section 182, 184 and wing section 188, 190 to impart interposer piece 172 with an I-shaped planform geometry, as viewed looking downwardly onto interposer piece 172 along an axis orthogonal to a die mount surface 194 of base structure 174. When enclosed in a package body, wing section 182, 184 may reside adjacent a first sidewall portion of PA package 86; wing section 188, 190 may reside adjacent a second, opposing sidewall portion of PA package 86; and central wall section 192 may extend at least a majority, if not the substantial entirety of the width of PA package 86 as measured along an axis perpendicular to the package height direction and parallel to the axis along which central wall section 192 is elongated.

Fabricating a given TTI arrangement as a single, relatively large interposer piece, such as interposer piece 214 shown in FIGS. 16 and 17, may help streamline PA package fabrication by, for example, allowing a reduced number of interposer pieces to be placed on a leadframe array during batch manufacture. Further illustrating this point, a magnified view of H-shaped interposer piece 172, as reduced to practice and bonded to a leadframe array 212, is further shown in FIG. 18. Following attachment of interposer piece 172, various additional steps are carried-out to further process leadframe array 212 and produce a number of PA packages as, for example, generally described above in connection with FIGS. 11-14. When completed, PA package 170 may thus possess a topside I/O interface defined by upper interposer pads 198, 200, 202, 204, 206 exposed through the package frontside. When containing one or more RF power dies bearing FETs, electrically-conductive ground, gate, drain, and shield paths may be formed through interposer piece 172, which may assume the form of a single PCB cut to the desired shape or another dielectric (e.g., a ceramic) body in which interposer vias 208, 210 are embedded. Further, in such embodiments, (i) first gate and second gate conductive paths may be provided by interposer vias extending vertically through wing section 182, 184 of interposer piece 172; (ii) first drain and second drain conductive paths may be provided by interposer vias extending vertically through wing section 188, 190 of interposer piece 172; and (iii) a ground paths may be provided by one or more interposer vias extending vertically through central wall section 192 of interposer piece 172.

Figure 19:
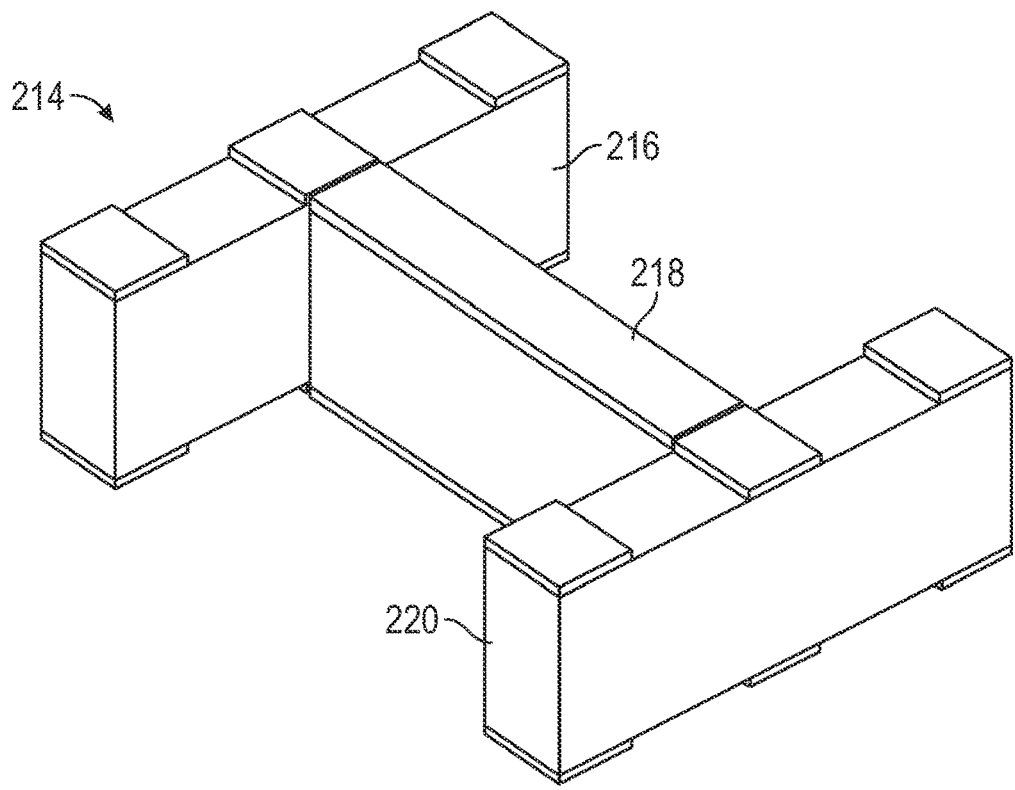
FIGS. 19-31 present several alternative example embodiments of TTI arrangements suitably incorporated into embodiments of a leadless PA package, such as the leadless PA package shown in FIGS. 1-15.
Figure 20:
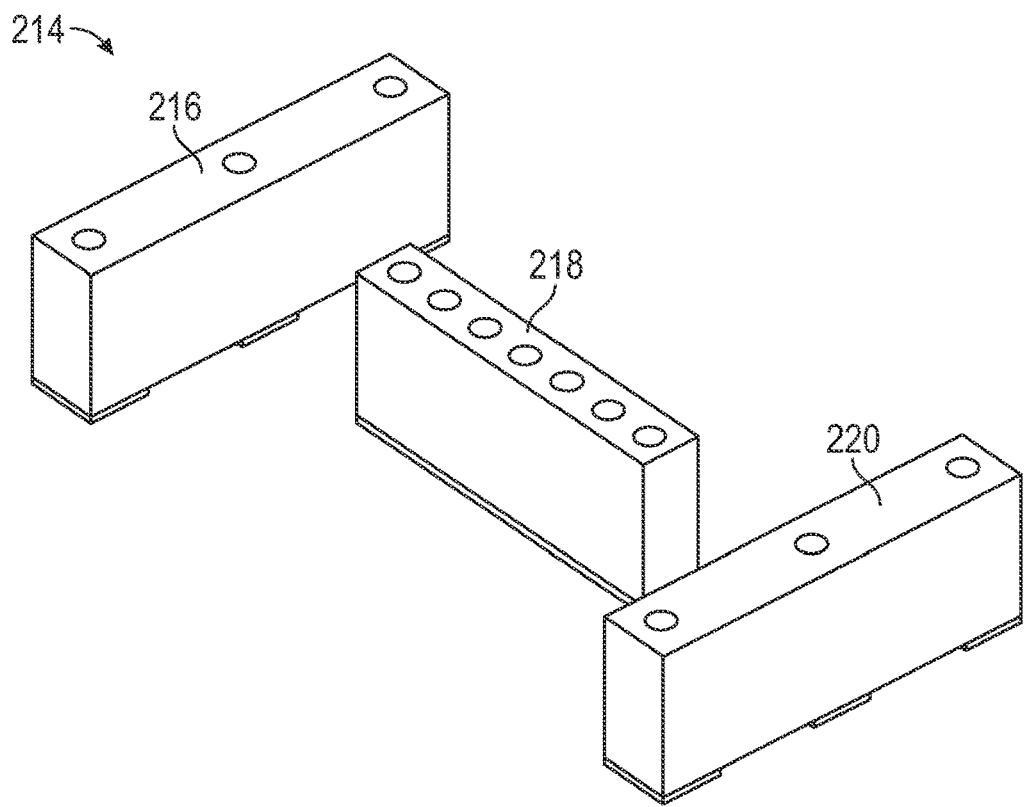

Turning next to FIGS. 19-31 present several alternative embodiments of TTI arrangements suitable for incorporation into a leadless PA package, such as the leadless PA package shown in FIGS. 1-8, are presented. Referring initially to FIGS. 19 and 20, embodiments of the TTI arrangement (here, identified by reference numeral "214") may include multiple interposer pieces 216, 218, 220, which may be placed in close proximity and which can potentially abut or physically contact to form the desired TTI arrangement 214. Thus, in the present example, TTI arrangement 214 encompasses an I-shaped planform geometry similar to the planform geometry of interposer piece 172 discussed above in connection FIGS. 16-18. However, in contrast to TTI arrangement 172, TTI arrangement 214 is not formed as single structure, but is rather assembled from interposer pieces 216, 218, 220, which each have a linear or elongated rectangular geometry. This may ease fabrication may allow a relatively long strip to be initially fabricated containing multiple interconnected interposer pieces, which are then separated by singulation before assembly of TTI arrangement 214. The individual interposer pieces 216, 218, 220 may then be placed in their desired position by bonding to the corresponding contacts of the base structure, such as interposer mount contacts and a base flange of the type previously described. If desired, interposer pieces 216, 218, 220 may be bonded together or otherwise joined prior to attachment to the base structure to simplify placement in embodiments; while, in other instances, this may not be the case.

Figure 21:
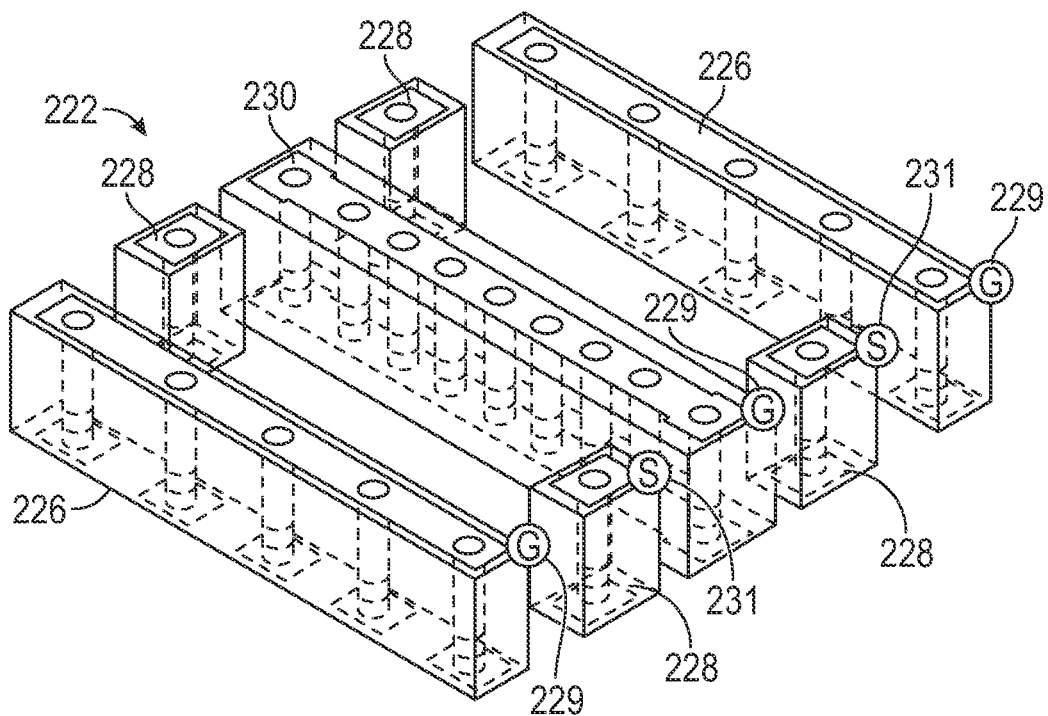

FIG. 21 is an isometric view of a TTI arrangement 222 including a central isolation wall and further including opposing peripheral or lateral isolation walls. In this example embodiment, TTI arrangement 222 is assembled from multiple interposer pieces 226, 228, 230, which are positioned in a spaced grouping or non-contacting relationship. Generally considered, interposer pieces 228 and 230, including interposer piece 230 defining a central isolation wall, are similar to or substantially identical to interposer pieces 116-119 of TTI arrangement 129 contained in leadless PA package 86, as described in detail above in connection with FIGS. 2-14. However, in contrast to TTI arrangement 129 (FIGS. 2-14), TTI arrangement 222 further includes two additional interposer sidewall pieces 226, which are positioned on opposing sides of interposer pieces 228, 230 and which define the above-referenced lateral isolation walls. As in the case for interposer piece 230 defining the central isolation wall of TTI arrangement 222, rows of electrically-conductive vias are formed through interposer pieces 226 (defining the lateral isolation walls) and are electrically coupled to a non-illustrated base flange or another grounded contact within the PA package or device into which TTI arrangement 222 is ultimately incorporated. By virtue of this construction, in embodiments in which such a PA package is imparted with a Doherty PA architecture, additional EM shielding is provided not only by the central isolation wall (here, provided in the form of interposer piece 230) positioned between the peaking and carrier signal amplification paths (generally extending between the signal I/O terminals provided by interposer pieces 228), but additional EM shielding is further provided in lateral directions through the package sidewalls by interposer pieces 226. In effect, an EM isolation ring is created surrounding the RF power die or dies and other circuitry within the PA package into which TTI arrangement 222 is incorporated to provide enhanced noise rejection and other benefits.

Whether or not formed to include a central isolation wall and/or lateral isolation walls as just described, TTI arrangement 222 can may be beneficially adapted or structurally configured to provide enhanced isolation of signal-carrying vias, to provide a controlled impedance transition in a thickness or package height direction, or to provide a combination of such functions. With respect to the provision of enhanced isolation of the signal-carrying vias, specifically, TTI arrangement 222 may be provided with a ground-signal-ground via arrangement, as indicated by markers 229, 231 appearing on the right side of FIG. 21 (equally applicable to the corresponding structure appearing on the left side of this drawing figure). Markers 231 identify the vias and corresponding topside terminations within TTI arrangement 222 that may serve to carry RF I/O signals in a package height or thickness direction. Comparatively, markers 229 identify the vias and corresponding topside terminations within example TTI arrangement 222 that may be electrically grounded to provide increased isolation of RF I/O signals during usage. As can be seen, the signal-carrying vias formed through TTI arrangement 222 are each flanked by a grounded via, with the signal-carrying vias and the grounded vias extending essentially in parallel in Z- or package height direction. Stated differently, the vias are arranged in a row extending along outer edge portion of TTI arrangement 222 with a signal-carrying via (and thus the corresponding input or output frontside terminal) positioned between two electrically-grounded vias. The electrical performance characteristics, such as the signal-to-noise ratio and leakage characteristics, of the PA package into which TTI arrangement 222 is incorporated may thus be enhanced by incorporating such a flanked or co-axial ground-signal-ground via arrangement or topology, as extending through TTI arrangement 222 in the package height direction. Additionally or alternatively, impedance matching on the signal input side and/or signal output side of TTI arrangement 222 can also be achieved through appropriate material selection, dimensioning of the vias within TTI arrangement 222, and dimensioning of the via-to-via spacing. This, in effect, may enable a controlled impedance transition in the thickness or package height direction between the topside I/O interface of the package incorporating TTI arrangement 222 and the base structure or substrate to which the circuit components (e.g., RF power dies and/or IC dies) are mounted.

Figure 22:
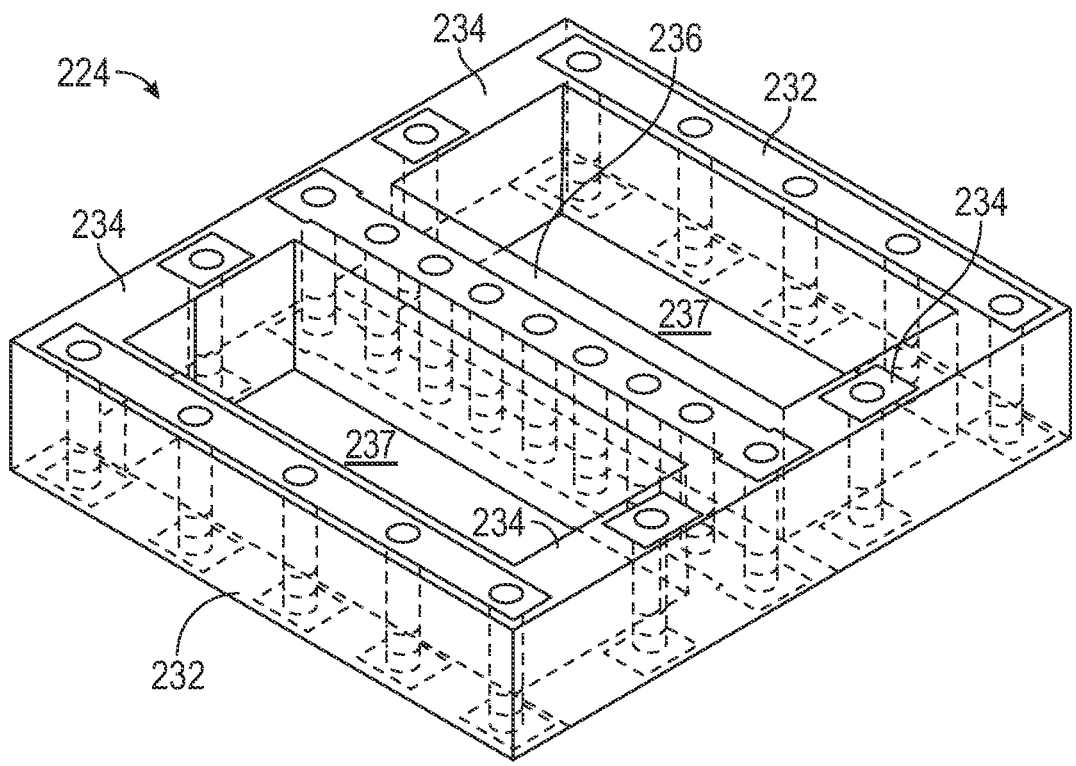

FIG. 22 presents an isometric view of a further example TTI arrangement 224 similar to TTI arrangement 222 shown in FIG. 21, but constructed from a single interposer structure 232, 234, 236. Specifically, interposer structure 232, 234, 236 is shaped and dimensioned to possess a figure-eight planform geometry, which generally encompasses the volume of space occupied by interposer pieces 226, 228, 230 contained in TTI arrangement 222 described above in connection with FIG. 21. Accordingly, interposer sidewall sections 234 of interposer structure 232, 234, 236 may provide essentially same functionality as interposer pieces 228 (FIG. 21); sections 234 of interposer structure 232, 234, 236 may provide the same functionality as interposer pieces 228; and sections 234 of interposer structure 232, 234, 236 may provide the same functionality as interposer pieces 228. In this regard, sections 232, 234 of TTI arrangement 224, including peripheral wall sections 232, collectively form an enclosed perimeter surrounding the circuitry contained in a completed PA device incorporating TTI arrangement 224 for enhanced EM shielding or noise reduction. Openings 237 formed vertically through interposer structure 232, 234, 236 may accommodate the RF power dies and other circuit components mounted to a non-illustrated base substrate or structure in the completed PA package. The ground-signal-ground via topology and impedance transition configurations described above in connection with TTI arrangement 222 (FIG. 21) are also equally applicable to example TTI arrangement 224; and, more generally, to the other example TTI arrangements described herein having suitable groupings or spatial arrangements of vias. In still further embodiments, TTI arrangement 224 may lack a central isolation wall, may lack one or both of the peripheral isolation walls, or may otherwise differ from the illustrated examples.

Figure 23:
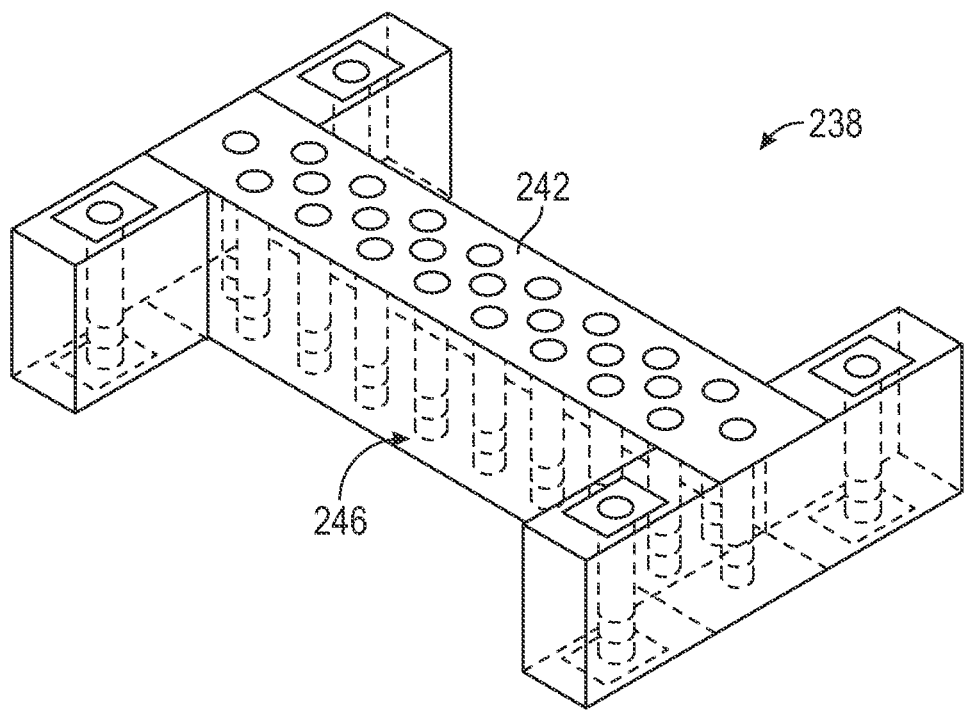
Figure 24:
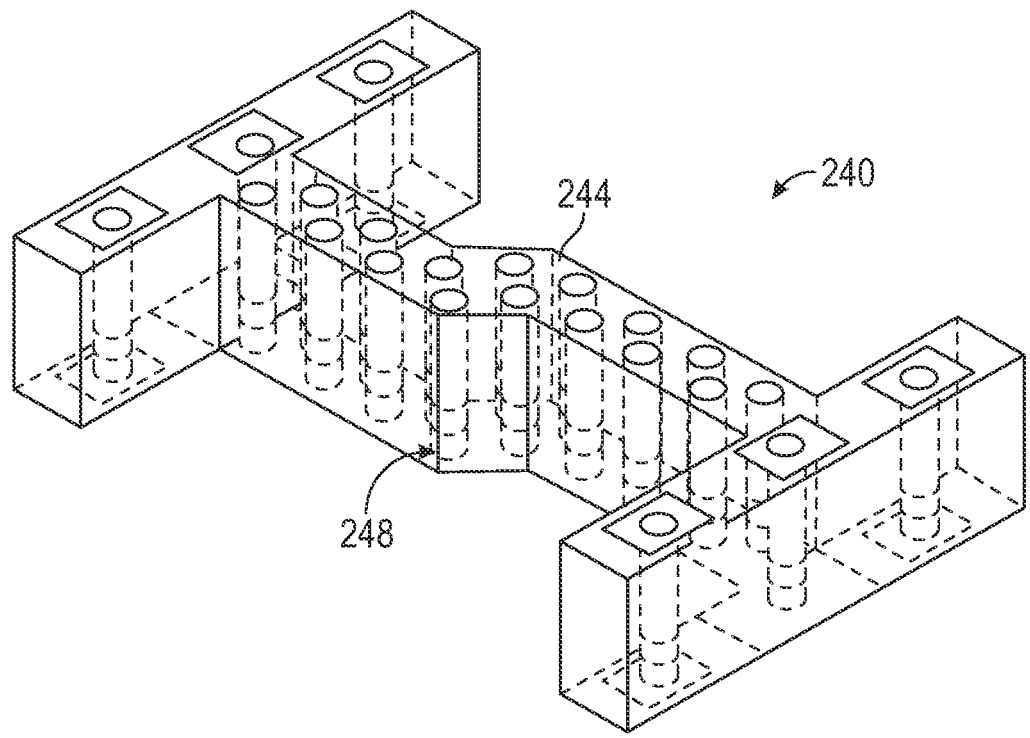
Figure 25:
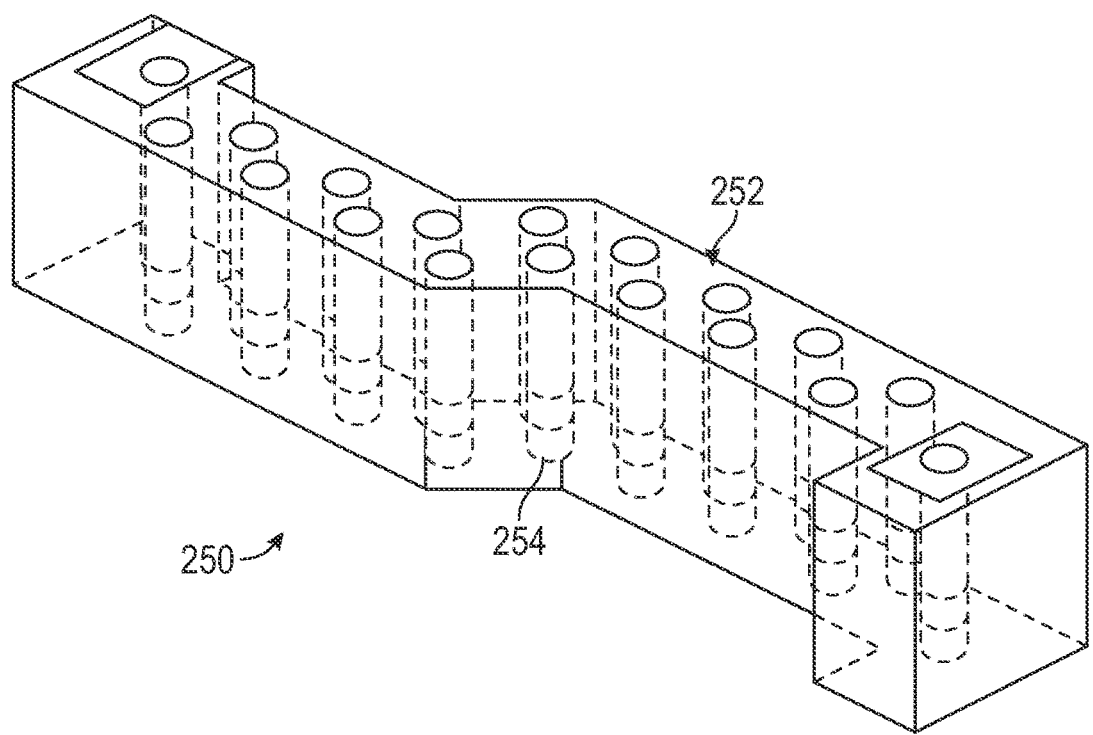
Figure 26:
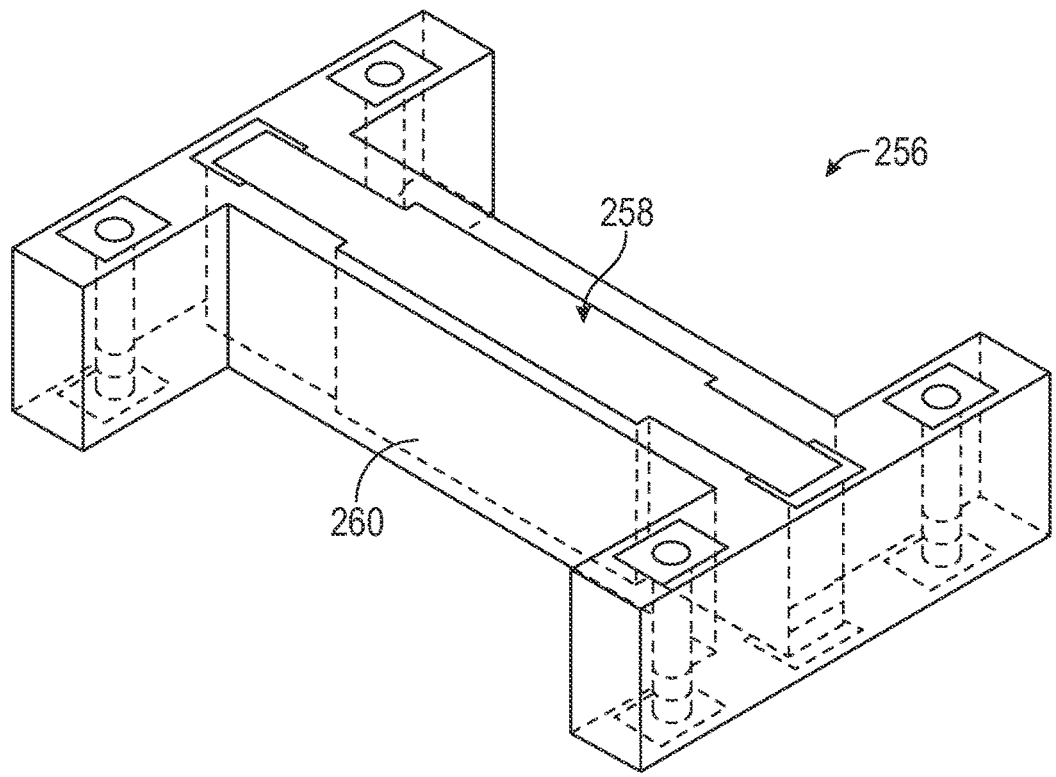
Figure 27:
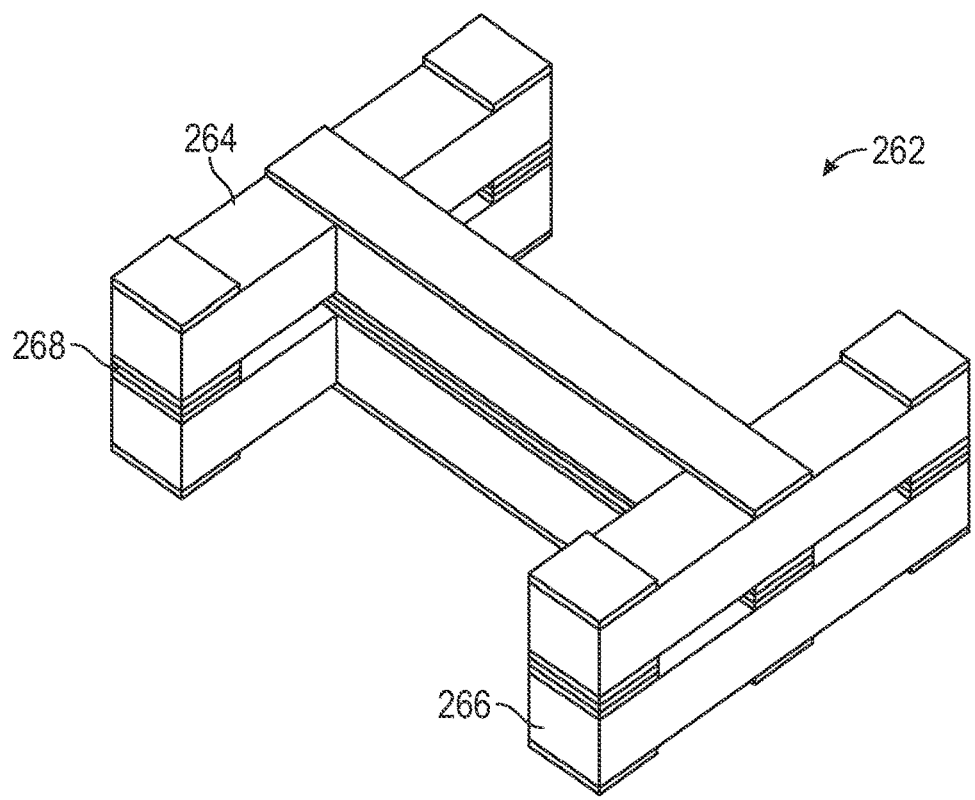
Figure 28:
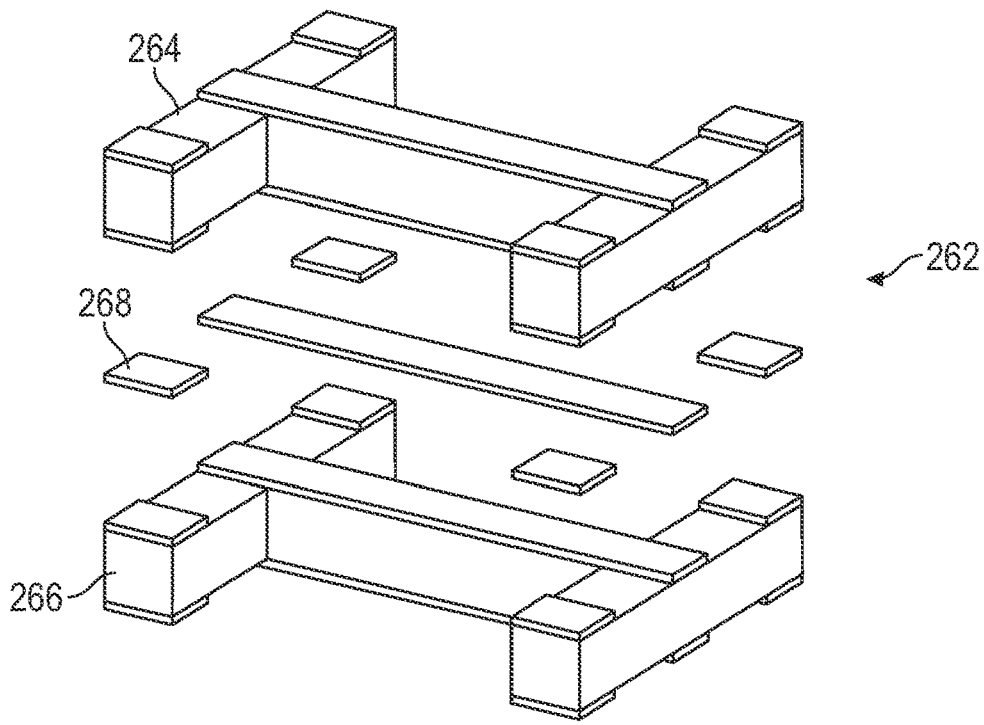

Advancing to FIGS. 23 and 24, two additional example TTI arrangements 238, 240, each generally having an I-shaped planform geometry, are further presented. As was the case with interposer piece 172 described above in connection with FIGS. 16-18, TTI arrangements 238, 240 include central isolation walls 242, 244, respectively. However, in these further examples, central isolation walls 242, 244 each containing multiple staggered rows of embedded interposer vias 246, 248, which extend along the respective lengths of central isolation walls 242, 244 to provide enhanced shielding between circuitry (e.g., peaking and carrier RF power dies) disposed on opposing sides of walls 242, 244. In the case of TTI arrangement 238 shown in FIG. 23, central isolation wall 242 is imparted with a straight or linear planform geometry, as viewed along an axis orthogonal to the upper surface of TTI arrangement 238. In further embodiments, the central isolation wall (or any other potion of the TTI arrangement) may be milled or otherwise formed to possess a more complex geometry, such as a more complex polygonal or curved geometry. For example, as shown in FIG. 24, central isolation wall 244 included in TTI arrangement 240 is imparted with a more complex polygonal shape to, for example, accommodate larger microelectronic components within a PA package, to increase EM shielding in certain regions, or to provide other benefits. Relatedly, in various embodiments of the TTI arrangement, the central isolation wall (when provided) may be formed utilizing one or more separate interposer pieces, with FIG. 25 further depicting an example of such an interposer structure 250 principally defining a central isolation wall 252 containing a number of electrically-conductive (e.g., grounded) vias 254 arranged in multiple staggered rows. In still other instances, the central isolation wall (when provided) may contain one or more bar vias, which are elongated along the length of the central isolation wall. For example, in this latter regard, an interposer piece 256 (FIG. 26) may be formed to include a central isolation wall 258 containing a single (or perhaps several) bar vias, which may extend for the majority, if not the substantial entirety of the length of central isolation wall 260. In still other instances, one or more outer sidewall surfaces of central isolation wall 260 may be externally plated or otherwise coated with an electrically-conductive material to provide the desired EM shielding.

In still further embodiments, the TTI arrangement may contain multiple stacked interposer pieces to impart the TTI arrangement with a cumulative desired height. This may be appreciated by referring to the example shown in FIGS. 27 and 28 in which a TTI arrangement 262 is formed by two interposer pieces 264, 266, which are bonded in a vertically-stacked relationship; that is, interposer pieces 264, 266 are stacked and bonded in a package height direction. Interposer pieces 264, 266 are joined by an electrically-conductive bonding material 268, such as a solder or a sintered bond material of the type described above. When integrated into a given PA package, such as package similar or substantially identical PA package 86 described above in connection with FIGS. 2-14, the lower interposer pads of lower interposer piece 266 may be bonded to non-illustrated interposer mount pads and a base flange, as previously described; the upper interposer pads of lower interposer piece 266 may be bonded to the lower interposer pads of upper interposer piece 264 by bonding material 268; and the upper interposer pads of upper interposer piece 264 may be exposed through the package frontside to help define the package topside I/O interface. By stacking multiple interposer pieces 264, 266 in this manner, TTI arrangement 262 may be imparted with an increased height as may be useful when, for example, the PA package into which TTI arrangement 262 is incorporated has a greater height and/or interposer pieces 264, 266 are produced to have multi-layer PCB constructions. Generally, then, the incorporation of a TTI arrangement including one or more interposer pieces (whether stacked or disposed in another arrangement or grouping) enables significant flexibility in PA package design including, for example, flexibility in selecting the dielectric thickness, material, metallization and structure layout of the interposer piece or pieces forming a given TTI arrangement Turning lastly to FIGS. 29, 30, and 31, a further example TTI arrangement 270 is shown in isometric, cross-sectional, and exploded views, respectively. As was previously the case, TTI arrangement 270 contains multiple interposer pieces 272, 274 positioned in a stacked relationship. More specifically, in the instant example, TTI arrangement 270 includes upper and lower interposer pieces, which are physically bonded together and electrically interconnected utilizing an electrically-conductive bonding material 276. Generally, electrical interconnectivity is provided from the lower interposer pads of lower interposer piece 272; through vias 278 contained in the dielectric body 280 of lower interposer piece 272; through the bodies of bonding material 276; through the lower interposer pads of upper interposer piece 274; through vias 282 contained in the dielectric body 284 of upper interposer piece 274; and to the upper interposer pads of upper interposer piece 274 to form the frontside I/O interface of the completed PA package. Notably, and in contrast to stacked TTI arrangement 262 shown in FIGS. 27 and 28, TTI arrangement 270 may be well-suited for incorporation into a PA package containing one or more gas-filled cavities, commonly referred to as an "air cavity package." Accordingly, and as is readily observed in FIGS. 30 and 31, one or more cavities may be formed in lower interposer piece 272 to accommodate the circuitry components and wirebonds (if present) when TTI arrangement 270 is incorporated into a larger PA package. Comparatively, upper interposer piece 274 may be formed as a solid structure or lid, which may lack any such openings. Upper interposer piece 274 may have a multi-layer (e.g., PCB) construction, may be composed of a dielectric block of material through which vias are formed, or may otherwise have a construction suitable for enclosing the air cavity within TTI arrangement 270 in embodiments. Generally, then, upper interposer piece 274 may be considered an upper lid piece or section having upper interposer pads opposite lower interposer piece 272, with the upper interposer pads potentially defining the frontside I/O interface of the completed PA package in a manner analogous to that previously described.

Dielectric sealant layers 286, 288 are further provided to provide airtight, or essentially airtight, joints at the mating interfaces between interposer pieces 272, 274 and the non-illustrated base structure to which lower interposer piece 272 is mounted. Sealant layers 272, 274 can be composed of various dielectric bonding materials or systems, including epoxy materials. In one embodiment, sealant layers 272, 274 are produced from a material, such as carbon or fiberglass, pre-impregnated with a resin, which are commonly referred as a "prepreg" materials and which may be provided in a tape-like format with an adhesive backing for ready application. In this manner, a PA package can be fabricated having one or more sealed air cavities (that is, cavities occupied by air or another entrapped gas) utilizing a TTI arrangement of the type described herein and further possessing the other beneficial characteristics described throughout this document In other implementations, multiple interposer pieces, whether stacked or otherwise provided in a contacting or abutting relationship, may have other structural features (e.g., interlocking geometries) or may be sealingly joined in a different manner; e.g., in embodiments, notches, trenches, or similar features may be cut into or otherwise formed in interposer pieces 272, 274 to help occupy any air gaps, along with a suitable sealant or bonding material, when interposer pieces 272, 274 are positioned in a stacked relationship. Similarly, in various implementations in which the TTI arrangement is incorporated into an overmolded package, such slots, openings, trenches, or similar features may be cut into or otherwise formed in the interposer pieces to facilitate the flow of mold material and complete (void free) filling of the desired mold volume during the overmolding process. The number of interposer pieces making-up a particular TTI arrangement, as well as the spacing between the interposer pieces, can also be selected or tailored by design to facilitate complete (void free) overmolding in embodiments in which a given TTI arrangement is incorporated into an overmolded or plastic package.

Figure 29:
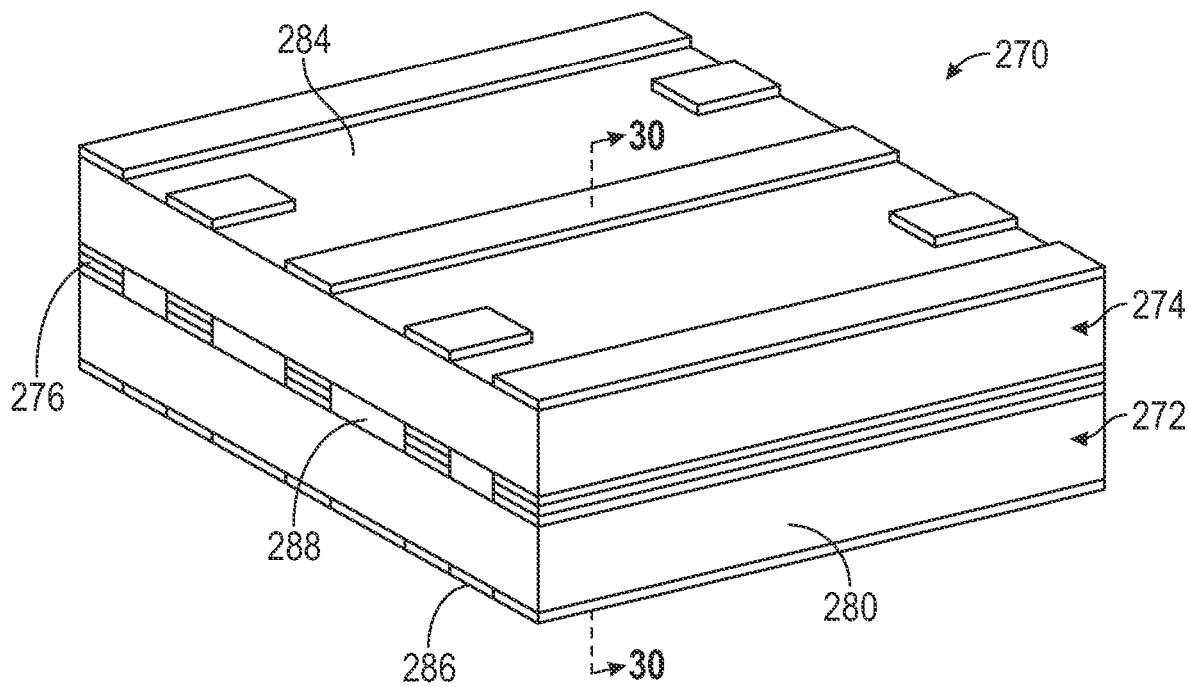
Figure 30:
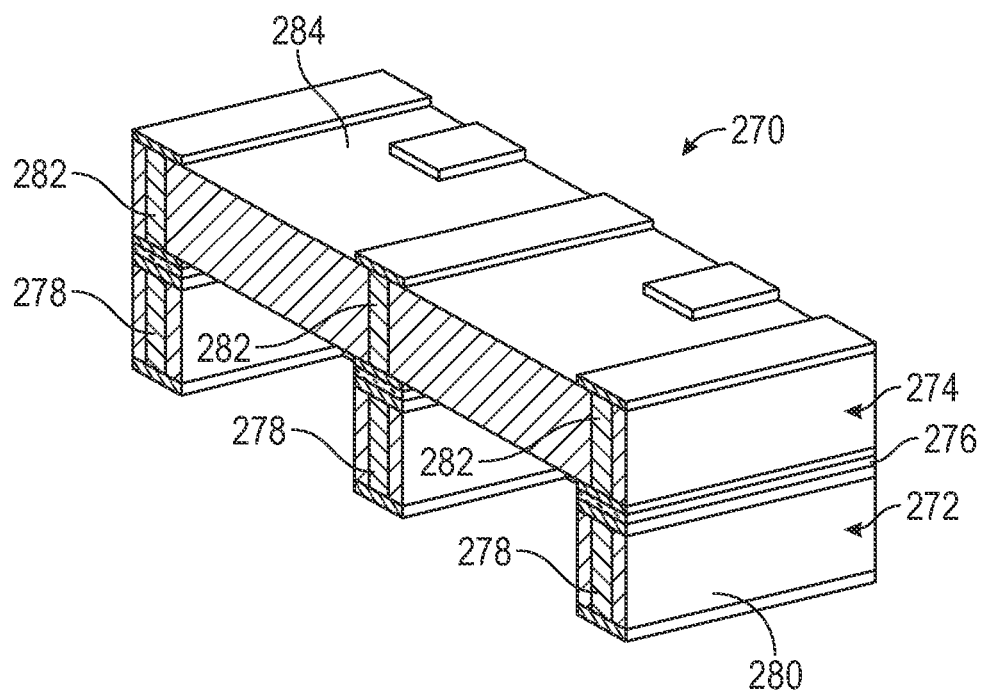
Figure 31:
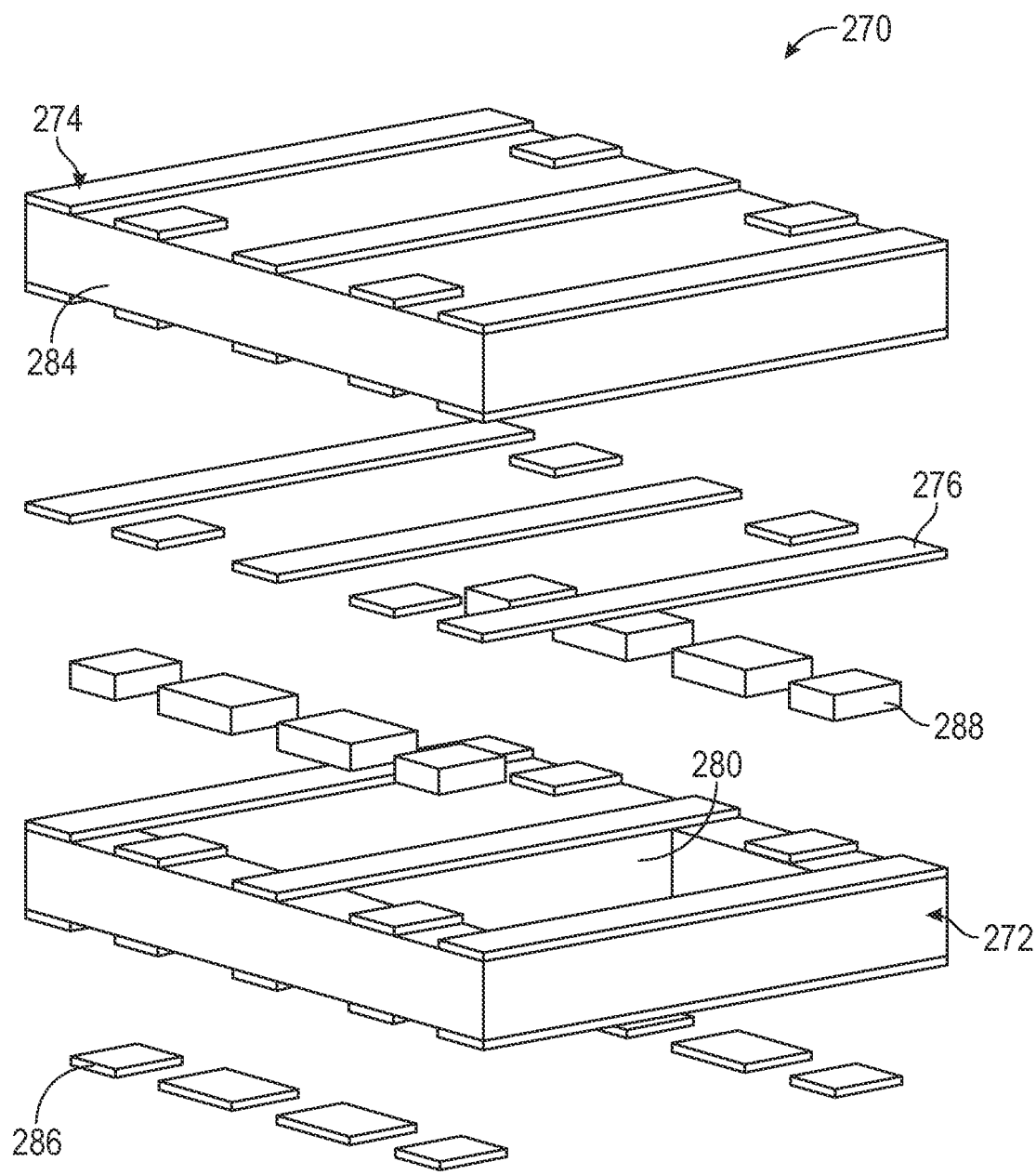

In the case of example TTI arrangement 270 shown in FIGS. 29-31, one or both of interposer pieces 272, 274 may be initially provided as relatively large, physically-interconnected array for manufacturing efficiency. In this case, such an interposer piece array may contain a plurality of other similar or identical interposer pieces in addition to a given one of interposer pieces 272, 274. Such an interposer piece array may be utilized to fabricate a relatively large number of (e.g., several dozen or more) PA packages in parallel, with the connective features or tie bars of the interposer piece array subsequently singulated at an appropriate juncture during the manufacturing process. Such statements also pertain to most, if not essentially all of the TTI arrangements described throughout this document, particularly those TTI arrangements containing a single, relatively large interposer piece (e.g., as in the case of example TTI arrangements 170, 224, 238, 240, 256 shown in FIGS. 16-18, 22-24, and 26) or containing multiple stacked interposer pieces (e.g., TTI arrangement 262 shown in FIGS. 27-28). Accordingly, in the case of such TTI arrangements, the interposer pieces processed to fabricate a number of PA packages in parallel may be initially physically tied together in an array or leadframe-type format, which is positioned over a relatively large processing area across which any number of partially-fabricated PA packages are produced utilizing a suitable manufacturing process; e.g., a manufacturing process similar to that described above in connection with FIGS. 11-14. Again, such an array of interposer pieces may be sawed or otherwise singulated at an appropriate juncture (e.g., following the above-described overmolding and back-grinding processes) to produce a relatively large number of PA packages incorporating TTI arrangements in a bath-style fabrication approach to improve the overall efficiency and lower manufacturing costs.

Conclusion

PA packages containing unique topside termination interposer (TTI) arrangements, and methods for fabricating such PA packages, have been provided. Embodiments of the leadless packages can be fabricated to include TTI arrangement and interposer mount pads, which facilitate the formation of topside I/O interfaces utilizing reliable, cost-effective manufacturing processes; e.g., leadframe-based processing, global overmolding, and streamlined electroplating techniques. Additionally, embodiments of the leadless PA packages may include bottomside thermal interfaces, separating the primary heat dissipation path from the electrical signal paths of the PA package to improve thermal performance, while facilitating installation in larger electronic assemblies or systems. Unique in-package, central isolation walls may further be deployed within the PA packages, including electrically-active (e.g., grounded) central isolation walls, for enhanced EM shielding and RF performance benefits. PA packages, such as leadless PA (e.g., DFN and QFN) packages, may thus be fabricated having optimized RF and thermal performance characteristics, while amenable to production utilizing streamlined fabrication processes. The above-described interposer piece or pieces contained in a given TTI arrangement are also readily manufacturable and, thus, cost effective enable production of the leadless PA packages.

Embodiments of a leadless PA package have been disclosed including a base flange, a first set of interposer mount pads spaced from the base flange, a first RF power die, a TTI arrangement, and a package body. The base flange has a die mount surface and a lower flange surface located opposite the die mount surface in a package height direction. The first RF power die is attached to the die mount surface of the base flange and electrically interconnected with the first set of interposer mount pads. The TTI arrangement is electrically coupled to the first set of interposer mount pads and projects therefrom in the package height direction. The package body encloses the first RF power die and having a package topside surface opposite the lower flange surface, with the package topside surface extending substantially parallel to the die mount surface. The leadless PA package further includes topside I/O terminals, which are accessible from the package topside surface and which are electrically interconnected with the first RF power die through the TTI arrangement and the first set of interposer mount pads. In at least some implementations, the TTI arrangement may include lower interposer pads bonded to the first set of interposer mount pads; and upper interposer pads electrically coupled to the lower interposer pads and exposed at the package topside surface to define at least a portion of the topside I/O terminals. Additionally, in embodiments, the TTI arrangement may assume the form or include a first interposer piece. The first interposer piece may contain a dielectric interposer body on which multiple ones of the upper interposer pads and multiple ones of the lower interposer pads are formed, as well as interpose vias extending within the dielectric interposer body to electrically interconnect the upper interposer pads and the lower interposer pads formed on the dielectric interposer body.

In further embodiments, the leadless PA package includes a package body having a topside surface, topside I/O terminals accessible from the topside surface of the package body, a first RF power die contained in the package body, a base structure to which the first RF power die is mounted, and a TTI arrangement. The TTI arrangement includes, in turn, upper interposer pads exposed through though the topside surface of the package body to define the topside I/O terminals, lower interposer pads electrically coupled to the base structure, and interposer vias electrically coupling the upper interposer pads to the lower interposer pads. The first RF power die is electrically coupled to the topside I/O terminals through the TTI arrangement and the base structure. In certain implementations, the leadless PA package also includes a second RF power die, which is further contained in the package body and which is electrically coupled to the topside I/O interface through the TTI arrangement and the base structure. In such implementation, the TTI arrangement may contain a central isolation wall extending between the first RF power die and the second RF power die; and, in at least some instances in which the I/O terminals includes a ground contact or terminal (e.g., a source terminal when the RF power die or dies contained in the PA package carry one or more FETs), the ground terminal is electrically coupled to a base flange (which is contained in the base structure) through the central isolation wall. Additionally or alternatively, the embodiment of the TTI arrangement may include or assume the form of at least one interposer piece having a dielectric body through which one or more of the interposer vias extend.

In still further embodiments, a leadless PA package includes a base flange having a die mount surface and a lower flange surface, which is located opposite the die mount surface in a package height direction. Interposer mount pads are spaced from the base flange, while one or more IC dies (including or consisting of at least one RF power die) are attached to the die mount surface of the base flange and electrically interconnected with the interposer mount pads. One or more interposer pieces contained in a TTI arrangement are electrically coupled to the interposer mount pads and projecting therefrom in the package height direction, and a package body encloses the IC die or dies (e.g., at least one RF power die) and has a package topside surface opposite the lower flange surface. The package topside surface may extend substantially parallel to the die mount surface in at least some instances. Topside I/O terminals are accessible from the package topside surface and are electrically interconnected with the IC die or dies through the TTI arrangement and the interposer mount pads. Further, in certain realizations, the package body assumes the form of an overmolded package body having an outer principal surface at least partially defining the package topside surface, and the topside I/O terminals assume the form of terminal end surfaces of upper interposer pads included in the TTI arrangement (plated or non-plated), which are exposed along and substantially coplanar with the outer principal surface of the overmolded package body.

Methods for fabricating leadless PA packages have been further provided. In embodiments, the method includes the steps or processes of: (i) providing a first set of interposer mount pads and a base flange spaced from the first set of interposer mount pads, the base flange having a die mount surface and a lower flange surface opposite the die mount surface in a package height direction; (ii) attaching at least a first RF power die to the die mount surface of the base flange; (iii) electrically interconnecting the first RF power die and the first set of interposer mount pads; (iv) before or after electrically interconnecting the first RF power die and the first set of interposer mount pads, providing a TTI arrangement electrically coupled to the first set of interposer mount pads and projecting therefrom in the package height direction; (v) enclosing the first RF power die in a package body defining, at least in substantial part, a package topside surface located opposite the lower flange surface; and (vi) forming topside I/O terminals accessible from the package topside surface and electrically interconnected with the first RF power die through the first set of interposer mount pads and the TTI arrangement. In various embodiments in which the leadless PA package is fabricated to include an overmolded package body, the topside I/O terminals may be formed by exposing upper interpose pads included in the TTI arrangement utilizing a back-grinding process.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A leadless power amplifier (PA) package, comprising:
   a base flange having a die mount surface and a lower flange surface located opposite the die mount surface in a package height direction;
   a first set of interposer mount pads spaced from the base flange;
   a first radio frequency (RF) power die attached to the die mount surface of the base flange and electrically interconnected with the first set of interposer mount pads;
   a topside termination interposer (TTI) arrangement electrically coupled to the first set of interposer mount pads and projecting therefrom in the package height direction;
   a package body enclosing the first RF power die and having a package topside surface opposite the lower flange surface, the package topside surface extending substantially parallel to the die mount surface; and
   topside input/output (I/O) terminals accessible from the package topside surface and electrically interconnected with the first RF power die through the TTI arrangement and through the first set of interposer mount pads.

2. The leadless PA package of claim 1, wherein the TTI arrangement comprises:
   lower interposer pads bonded to the first set of interposer mount pads; and
   upper interposer pads electrically coupled to the lower interposer pads and exposed at the package topside surface to define at least a portion of the topside I/O terminals.

3. The leadless PA package of claim 2, wherein the TTI arrangement comprises a first interposer piece including:
   a dielectric interposer body on which multiple ones of the upper interposer pads and multiple ones of the lower interposer pads are formed; and
   interposer vias extending within the dielectric interposer body to electrically interconnect the upper interposer pads and the lower interposer pads formed on the dielectric interposer body.

4. The leadless PA package of claim 1, further comprising:
   a second set of interposer mount pads spaced from the base flange; and
   a second RF power die attached to the die mount surface of the base flange and electrically coupled to the second set of interposer mount pads, the topside I/O terminals further electrically interconnected with the second RF power die through the TTI arrangement and the second set of interposer mount pads.

5. The leadless PA package of claim 4, wherein the first RF power die comprises a peaking RF power die positioned in a peaking signal amplification path of the leadless PA package; and
   wherein the second RF power die comprises a carrier RF power die positioned in a carrier signal amplification path of the leadless PA package.

6. The leadless PA package of claim 5, wherein the TTI arrangement comprises a central isolation wall positioned between the peaking RF power die and the carrier RF power die.

7. The leadless PA package of claim 6, wherein the central isolation wall comprises:
a dielectric interposer body;
a lower interposer pad formed on the dielectric interposer body and bonded to the base flange;
an upper interposer pad formed on the dielectric interposer body and defining a ground terminal included in the topside I/O terminals; and
at least one interposer via extending between the upper interposer pad and the lower interposer pad.

8. The leadless PA package of claim 7, wherein the at least one interposer via comprises at least one row of vias spaced along a length of the dielectric interposer body.

9. The leadless PA package of claim 7, wherein the at least one interposer via comprises a bar via extending within the dielectric interposer body in a lengthwise direction.

10. The leadless PA package of claim 6, wherein the TTI arrangement further comprises:
a first lateral isolation wall positioned on a first side of the central isolation wall and extending substantially parallel thereto, the peaking signal amplification path extending between the first lateral isolation wall and the central isolation wall; and
a second lateral isolation wall positioned on a second, opposing side of the central isolation wall and extending substantially parallel thereto, the carrier signal amplification path extending between the second lateral isolation wall and the central isolation wall.

11. The leadless PA package of claim 1, wherein at least a portion of the TTI arrangement has an I-shaped geometry, as viewed looking downwardly on the TTI arrangement along an axis orthogonal to the die mount surface of the base flange.

12. The leadless PA package of claim 11, wherein TTI arrangement is dimensioned such that the I-shaped geometry extends from a location adjacent a first sidewall of the leadless PA package to a location adjacent a second sidewall of the leadless PA package.

13. The leadless PA package of claim 1, wherein the TTI arrangement comprises multiple interposer pieces bonded in a stacked relationship in the package height direction.

14. The leadless PA package of claim 1, wherein the TTI arrangement comprises at least one interposer piece having a dielectric body in which at least one interposer via is formed.

15. The leadless PA package of claim 1, wherein the package body further comprises a package bottomside surface opposite the package topside surface; and
wherein the lower flange surface of the base flange is exposed through the package bottomside surface such a conductive heat extraction path extends from the first RF power die, through the base flange, and to the lower flange surface.

16. A leadless power amplifier (PA) package, comprising:
a package body having a topside surface;
topside input/output (I/O) terminals accessible from the topside surface of the package body;
a first radiofrequency (RF) power die contained in the package body;
a base structure to which the first RF power die is mounted; and
a topside termination interposer (TTI) arrangement, comprising:
upper interposer pads exposed through though the topside surface of the package body to define the topside I/O terminals;
lower interposer pads electrically coupled to the base structure; and
interposer vias electrically coupling the upper interposer pads to the lower interposer pads, the first RF power die electrically coupled to the topside I/O terminals through the TTI arrangement and the base structure.

17. The leadless PA package of claim 16, comprising a second RF power die further contained in the package body and electrically coupled to the topside I/O terminals through the TTI arrangement and the base structure;
wherein the TTI arrangement further comprises a central isolation wall extending between the first RF power die and the second RF power die.

18. The leadless PA package of claim 17, wherein the base structure comprises a base flange; and
wherein the topside I/O terminals comprise a ground terminal; and
wherein the ground terminal is electrically coupled to the base flange through the central isolation wall.

19. The leadless PA package of claim 16, wherein the TTI arrangement comprises at least one interposer piece having a dielectric body through which one or more of the interposer vias extend.

20. A method for fabricating a leadless power amplifier (PA) package, the method comprising:
providing a first set of interposer mount pads and a base flange spaced from the first set of interposer mount pads, the base flange having a die mount surface and a lower flange surface opposite the die mount surface in a package height direction;
attaching at least a first radio frequency (RF) power die to the die mount surface of the base flange;
electrically interconnecting the first RF power die and the first set of interposer mount pads;
before or after electrically interconnecting the first RF power die and the first set of interposer mount pads, providing a topside termination interposer (TTI) arrangement electrically coupled to the first set of interposer mount pads and projecting therefrom in the package height direction;
enclosing the first RF power die in a package body defining, at least in substantial part, a package topside surface located opposite the lower flange surface; and
forming topside input/output (I/O) terminals accessible from the package topside surface and electrically interconnected with the first RF power die through the first set of interposer mount pads and the TTI arrangement.

* * * * *